(12) United States Patent
Seo et al.

(10) Patent No.: US 8,873,493 B2
(45) Date of Patent: Oct. 28, 2014

(54) METHOD AND APPARATUS OF TRANSMITTING UPLINK SIGNAL

(75) Inventors: In Kwon Seo, Anyang-si (KR); Dae Won Lee, Anyang-si (KR); Ki Jun Kim, Anyang-si (KR); Joon Kui Ahn, Anyang-si (KR)

(73) Assignee: LG Electronics Inc., Seoul (KR)

( * ) Notice: Subject to any disclaimer, the term of this patent is extended or adjusted under 35 U.S.C. 154(b) by 127 days.

(21) Appl. No.: 13/574,525

(22) PCT Filed: Apr. 13, 2011

(86) PCT No.: PCT/KR2011/002634
§ 371 (c)(1),
(2), (4) Date: Jul. 20, 2012

(87) PCT Pub. No.: WO2011/129611
PCT Pub. Date: Oct. 20, 2011

(65) Prior Publication Data
US 2012/0320852 A1    Dec. 20, 2012

Related U.S. Application Data

(60) Provisional application No. 61/323,843, filed on Apr. 13, 2010, provisional application No. 61/324,291, filed on Apr. 14, 2010, provisional application No. 61/366,909, filed on Jul. 22, 2010, provisional application No. 61/369,080, filed on Jul. 30, 2010.

(30) Foreign Application Priority Data

Apr. 1, 2011 (KR) .................. 10-2011-0030166

(51) Int. Cl.
*H04W 4/00* (2009.01)
*H04J 3/00* (2006.01)
(Continued)

(52) U.S. Cl.
CPC .......... *H03M 13/353* (2013.01); *H04L 1/1858* (2013.01); *H04L 1/0072* (2013.01); *H04L 1/0041* (2013.01); *H04L 27/2601* (2013.01); *H03M 13/6525* (2013.01); *H03M 13/6544* (2013.01); *H03M 13/6362* (2013.01);
(Continued)

(58) Field of Classification Search
CPC . H04L 1/0072; H04L 1/1819; H04L 65/1069; H04L 65/4084; H04L 1/0026; H04L 1/0028; H04L 1/1664; H04W 72/0413; H04W 72/121
See application file for complete search history.

(56) References Cited

U.S. PATENT DOCUMENTS 7,912,133 B2 * 3/2011 Cheon et al. ............ 375/240.27
8,218,509 B2 * 7/2012 McCoy et al. ................ 370/336
(Continued)

FOREIGN PATENT DOCUMENTS

CN    101171644 A    4/2008
CN    101536391 A    9/2009
(Continued)

*Primary Examiner* — Melanie Jagannathan
(74) *Attorney, Agent, or Firm* — Birch, Stewart, Kolasch & Birch, LLP

(57) ABSTRACT

A method and apparatus for transmitting an uplink signal are disclosed. The method for transmitting an uplink signal by a communication apparatus in a wireless communication system includes channel encoding control information, and multiplexing the channel encoded control information with a plurality of data blocks by performing channel interleaving, wherein the number of channel encoded symbols for the control information is determined using an inverse number of the sum of a plurality of spectral efficiencies (SEs) for initial transmission of the plurality of data blocks.

18 Claims, 12 Drawing Sheets

(51) Int. Cl.
*H04N 11/04* (2006.01)
*H04W 72/00* (2009.01)
*H04L 1/18* (2006.01)
*H04L 1/00* (2006.01)
*H03M 13/00* (2006.01)
*H03M 13/35* (2006.01)
*H04L 1/16* (2006.01)
*H04L 27/26* (2006.01)
*H03M 13/09* (2006.01)
*H03M 13/23* (2006.01)
*H03M 13/29* (2006.01)

(52) U.S. Cl.
CPC ...... *H03M 13/6558* (2013.01); *H03M 13/6306* (2013.01); *H03M 13/6527* (2013.01); *H04L 1/1812* (2013.01); *H04L 1/1664* (2013.01); *H03M 13/09* (2013.01); *H03M 13/23* (2013.01); *H03M 13/29* (2013.01); *H03M 13/635* (2013.01); *H03M 13/653* (2013.01); *H04L 1/0071* (2013.01)

USPC ...... 370/329; 370/336; 370/342; 375/240.27; 375/324; 455/450

(56) References Cited

U.S. PATENT DOCUMENTS

| | | | |
|---|---|---|---|
| 8,588,259 B2 * | 11/2013 | Papasakellariou et al. | 370/535 |
| 2006/0245384 A1 | 11/2006 | Talukdar et al. | |
| 2010/0014474 A1 | 1/2010 | Miki et al. | |
| 2011/0243088 A1 * | 10/2011 | Ahn et al. | 370/329 |
| 2012/0044896 A1 * | 2/2012 | Kwon et al. | 370/329 |
| 2013/0022009 A1 * | 1/2013 | Yang et al. | 370/329 |

FOREIGN PATENT DOCUMENTS

| | | |
|---|---|---|
| EP | 2068483 A1 | 6/2009 |
| EP | 2 129 030 A1 | 12/2009 |
| WO | WO 2008/156338 A1 | 12/2008 |

* cited by examiner

FIG. 10

| MCS (CW0) | NDI (CW0) | MCS (CW1) | NDI (CW1) | PMI/RI | N_PRB | CQI request |
|---|---|---|---|---|---|---| transport block 1: MCS (CW0), NDI (CW0)
transport block 2: MCS (CW1), NDI (CW1)

(a)

| 25 | Toggled | 20 | Toggled | - | 10 | 1 |
|---|---|---|---|---|---|---|

(b)

| 20 | Toggled | 20 | Toggled | 6 | 14 | 1 |
|---|---|---|---|---|---|---|

(c)

METHOD AND APPARATUS OF TRANSMITTING UPLINK SIGNAL

CROSS REFERENCE TO RELATED APPLICATIONS

This application is the National Phase of PCT/KR2011/002634 filed on Apr. 13, 2011 which claims the benefit of U.S. Provisional Application No. 61/323,843 filed on Apr. 13, 2010; 61/324,291 filed on Apr. 14, 2010; 61/366,909 filed on Jul. 22, 2010; 61/369,080 filed on Jul. 30, 2010 and claims benefit to Patent Application No. 10-2011-0030166 filed in Republic of Korea, on Apr. 1, 2011. The entire contents of all of the above applications is hereby incorporated by reference.

TECHNICAL FIELD

The present invention relates to a wireless communication system, and more particularly to an apparatus and method for transmitting control information.

BACKGROUND ART

Wireless communication systems are widely used to provide various kinds of communication services such as voice or data services. Generally, a wireless communication system is a multiple access system that can communicate with multiple users by sharing available system resources (bandwidth, transmission (Tx) power, and the like). A variety of multiple access systems can be used, for example, a Code Division Multiple Access (CDMA) system, a Frequency Division Multiple Access (FDMA) system, a Time Division Multiple Access (TDMA) system, an Orthogonal Frequency Division Multiple Access (OFDMA) system, a Single Carrier Frequency Division Multiple Access (SC-FDMA) system, a Multi-Carrier Frequency Division Multiple Access (MC-FDMA) system, and the like.

DISCLOSURE

Technical Problem

Accordingly, the present invention is directed to a method and apparatus for transmitting an uplink signal that substantially obviate one or more problems due to limitations and disadvantages of the related art.

An object of the present invention devised to solve the problem lies on a method and apparatus for effectively transmitting an uplink signal in a wireless communication system. Another object of the present invention devised to solve the problem lies on a method and apparatus for effectively transmitting control information. A further object of the present invention devised to solve the problem lies on a method and apparatus for effectively multiplexing control information and data.

It is to be understood that objects to be achieved by the present invention are not limited to the aforementioned objects and other objects which are not mentioned will be apparent to those of ordinary skill in the art to which the present invention pertains from the following description.

Technical Solution

The object of the present invention can be achieved by providing a method for transmitting an uplink signal by a communication apparatus in a wireless communication system, the method including channel encoding control information; and multiplexing the channel encoded control information with a plurality of data blocks by performing channel interleaving, wherein the number of channel encoded symbols for the control information is determined using an inverse number of the sum of a plurality of spectral efficiencies (SEs) for initial transmission of the plurality of data blocks.

In another aspect of the present invention, provided herein is a communication apparatus for transmitting an uplink signal in a wireless communication system including a radio frequency (RF) unit, and a processor, wherein the processor channel-encodes control information, and performs channel interleaving, such that the channel encoded control information is multiplexed with a plurality of data blocks, and the number of channel encoded symbols for the control information is determined using an inverse number of the sum of a plurality of spectral efficiencies (SEs) for initial transmission of the plurality of data blocks.

The spectral efficiency (SE) for initial transmission of each data block is given as the following equation:

$$\frac{Payload_{Data}}{\lambda \cdot N_{RE\_PUSCH_{initial}}}$$

where, $Payload_{Data}$ is a size of a data block, $N_{RE\_PUSCH_{initial}}$ is the number of resource elements (REs) for initial Physical Uplink Shared Channel (PUSCH) transmission of the data block, and $\lambda$ is an integer of 1 or higher.

The number of channel encoded symbols for the control information is determined by the following equation:

$$\left\lceil \frac{Payload_{UCI}}{a} \cdot \frac{1}{\lambda'_1 \cdot SE_{Data(1)} + \lambda'_2 \cdot SE_{Data(2)} + \ldots + \lambda'_{(N)} \cdot SE_{Data(N)}} \cdot \beta_{offset}^{PUSCH} \right\rceil$$

where, $Payload_{UCI}$ is a size of the control information, $SE_{Data(i)}$ is a spectral efficiency for initial transmission of an i-th data block, $\beta_{offset}^{PUSCH}$ is an offset value, $\alpha$ is an integer of 1 or higher, $\lambda'_i$ is a constant, N is a total number of data blocks, and $\lceil \ \rceil$ is a ceiling function.

The number of channel encoded symbols for the control information is determined by the following equation:

$$\left\lceil \frac{Payload_{UCI}}{a} \cdot \frac{\lambda_1 \cdot N_{RE\_PUSCH(1)_{initial}} \cdot \lambda_2 \cdot N_{RE\_PUSCH(2)_{initial}}}{Payload_{Data(1)} \cdot \lambda_2 \cdot N_{RE\_PUSCH(2)_{initial}} + Payload_{Data(2)} \cdot \lambda_1 \cdot N_{RE\_PUSCH(1)_{initial}}} \cdot \beta_{offset}^{PUSCH} \right\rceil$$

where, $Payload_{UCI}$ is a size of the control information, $Payload_{Data(1)}$ is a size of a first data block, $N_{RE\_PUSCH(1)_{initial}}$ is the number of resource elements (REs) for initial PUSCH transmission of a first data block, Payload$_{Data(2)}$ is a size of a second data block, $N_{RE\_PUSCH(2)_{initial}}$ is the number of resource elements (REs) for initial PUSCH transmission of the second data block, $\beta_{offset}^{PUSCH}$ is an offset value, α is an integer of 1 or higher, $\lambda_1$ is an integer of 1 or higher, and $\lambda_2$ is an integer of 1 or higher, and ⌈ ⌉ is a ceiling function.

$N_{RE\_PUSCH(i)initial}$ is denoted by $N_{RE\_PUSCH_{initial}} = M_{sc}^{PUSCH(i)\text{-}initial} \cdot N_{symb}^{PUSCH(i)\text{-}initial}$ and a size of an i-th data block is denoted by $$\sum_{r=0}^{C^i-1} K_r^i,$$

where, $M_{sc}^{PUSCH(i)\text{-}initial}$ is the number of scheduled subcarriers for initial PUSCH transmission of the i-th data block, $N_{symb}^{PUSCH(i)\text{-}initial}$ is the number of SC-FDMA symbols for initial PUSCH transmission of the i-th data block, $C^{(i)}$ is the number of code blocks of the i-th data block, $K_r^{(i)}$ is a size of r-th code block of the i-th data block, and r is an integer of 0 or higher.

N is set to 2 (N=2), α is set to 1 (α=1), $\lambda_1$ is set to 1 ($\lambda_1$=1), and $\lambda_2$ is set to 1 ($\lambda_2$=1).

The control information is acknowledgement/negative acknowledgement (ACK/NACK) or Rank Indicator (RI).

In another aspect of the present invention, provided herein is a method for transmitting an uplink signal by a communication apparatus in a wireless communication system, the method including: channel encoding control information; and multiplexing the channel encoded control information with one of a plurality of data blocks by performing channel interleaving, wherein the number of channel encoded symbols for the control information is determined by the following equation:

$$\alpha \cdot \left\lceil \frac{Payload_{UCI} \cdot N_{RE\_PUSCH(x)_{initial}} \cdot \beta_{offset}^{PUSCH}}{Payload_{Data(x)}} \right\rceil$$

where, α is an integer of 1 or higher, Payload$_{UCI}$ is a size of the control information, $N_{RE\_PUSCH(s)_{initial}}$ is the number of resource elements (REs) for initial Physical Uplink Shared Channel (PUSCH) transmission of a data block x, $\beta_{offset}^{PUSCH}$ is an offset value, and ⌈ ⌉ is a ceiling function. The data block x denotes a data block having a highest Modulation and Coding Scheme (MCS) index for initial transmission from among the plurality of data blocks, and denotes a first data block when the plurality of data blocks have a same MCS index for initial transmission.

In another aspect of the present invention, provided herein is a communication apparatus for transmitting an uplink signal including a radio frequency (RF) unit; and a processor, wherein the processor channel-encodes control information, and performs channel interleaving, such that the channel encoded control information is multiplexed with a plurality of data blocks, and the number of channel encoded symbols for the control information is determined by the following equation:

$$\alpha \cdot \left\lceil \frac{Payload_{UCI} \cdot N_{RE\_PUSCH(x)_{initial}} \cdot \beta_{offset}^{PUSCH}}{Payload_{Data(x)}} \right\rceil$$

where, α is an integer of 1 or higher, Payload$_{UCI}$ is a size of the control information, $N_{RE\_PUSCH(x)_{initial}}$ is the number of resource elements (REs) for initial Physical Uplink Shared Channel (PUSCH) transmission of a data block x, $\beta_{offset}^{PUSCH}$ is an offset value, and ⌈ ⌉ is a ceiling function, wherein the data block x denotes a data block having a highest Modulation and Coding Scheme (MCS) index for initial transmission from among the plurality of data blocks, and denotes a first data block when the plurality of data blocks have a same MCS index for initial transmission.

$N_{RE\_PUSCH(x)_{initial}}$ is denoted by $N_{RE\_PUSCH(x)_{initial}} = M_{sc}^{PUSCH(x)\text{-}initial} \cdot N_{symb}^{PUSCH(x)\text{-}initial}$, and a size of the data block x is denoted $$\sum_{r=0}^{C^{(x)}-1} K_r^{(x)},$$

where $M_{sc}^{PUSCH(x)\text{-}initial}$ is the number of scheduled subcarriers for initial PUSCH transmission of the data block x, $N_{symb}^{PUSCH(x)\text{-}initial}$ is the number of SC-FDMA symbols for initial PUSCH transmission of the data block x, $C^{(x)}$ is the number of code blocks of the data block x, $K_r^{(x)}$ is a size of r-th code block of the data block x, and r is an integer of 0 or higher.

α is set to 1 (α=1).

The control information may include information related to channel quality.

The control information may include at least one of a Channel Quality Indicator (CQI) and a Precoding Matrix Indicator (PMI).

Advantageous Effects

Exemplary embodiments of the present invention have the following effects. The method and apparatus for transmitting an uplink signal according to the present invention can effectively transmit an uplink signal in a wireless communication system. In addition, control information and data can be effectively multiplexed.

It is to be understood that the advantages that can be obtained by the present invention are not limited to the aforementioned advantages and other advantages which are not mentioned will be apparent from the following description to the person with an ordinary skill in the art to which the present invention pertains.

DESCRIPTION OF DRAWINGS

The accompanying drawings, which are included to provide a further understanding of the invention, illustrate embodiments of the invention and together with the description serve to explain the principle of the invention.

In the drawings:

FIG. 10 exemplarily shows a DCI structure and a User Equipment (UE) analysis according to one embodiment of the present invention.

BEST MODE

Reference will now be made in detail to the preferred embodiments of the present invention with reference to the accompanying drawings. The detailed description, which will be given below with reference to the accompanying drawings, is intended to explain exemplary embodiments of the present invention, rather than to show the only embodiments that can be implemented according to the invention. The following embodiments of the present invention can be applied to a variety of wireless access technologies, for example, CDMA, FDMA, TDMA, OFDMA, SC-FDMA, MC-FDMA, and the like. CDMA can be implemented by wireless communication technologies, such as Universal Terrestrial Radio Access (UTRA) or CDMA2000. TDMA can be implemented by wireless communication technologies, for example, a Global System for Mobile communications (GSM), a General Packet Radio Service (GPRS), an Enhanced Data rates for GSM Evolution (EDGE), etc. OFDMA can be implemented by wireless communication technologies, for example, IEEE 802.11 (Wi-Fi), IEEE 802.16 (WiMAX), IEEE 802.20, E-UTRA (Evolved UTRA), and the like. UTRA is a part of a Universal Mobile Telecommunications System (UMTS). 3rd Generation Partnership Project (3GPP) Long Term Evolution (LTE) is a part of an Evolved UMTS (E-UMTS) that uses an E-UTRA. The LTE-Advanced (LTE-A) is an evolved version of 3GPP LTE.

Although the following embodiments of the present invention will hereinafter describe inventive technical characteristics on the basis of the 3GPP LTE/LTE-A system, it should be noted that the following embodiments will be disclosed only for illustrative purposes and the scope and spirit of the present invention are not limited thereto. Specific terms used for the exemplary embodiments of the present invention are provided to aid in understanding of the present invention. These specific terms may be replaced with other terms within the scope and spirit of the present invention.

Figure 1:
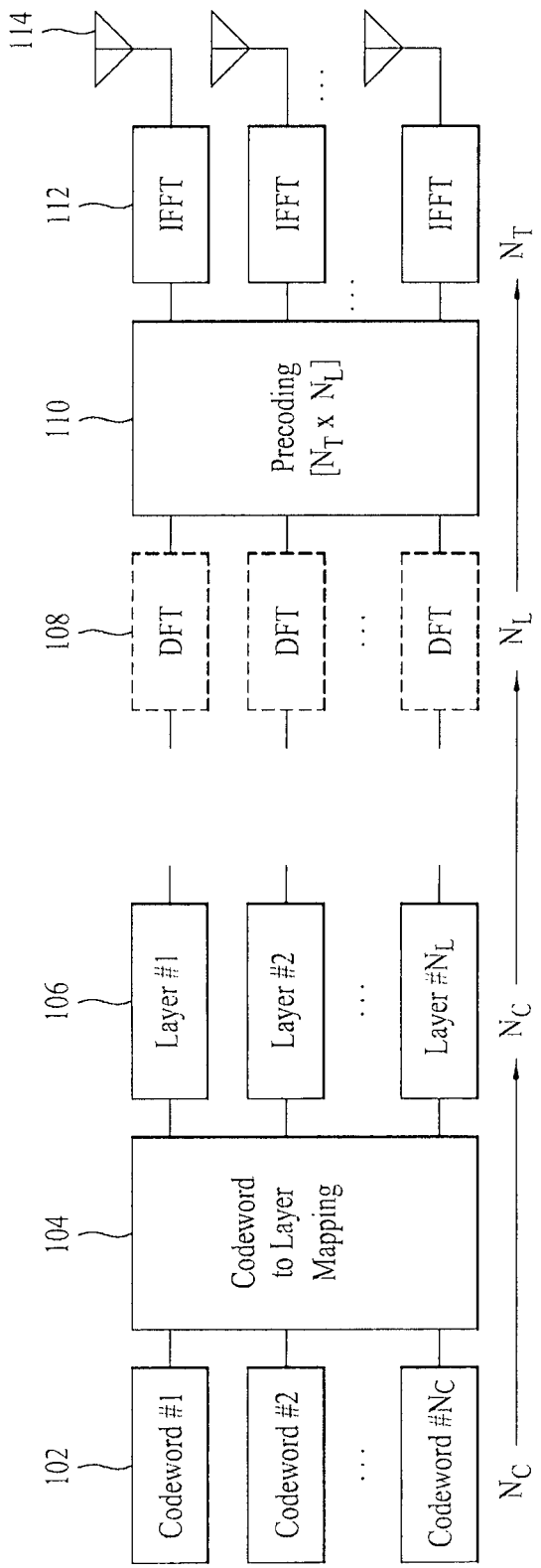
FIG. 1 is a block diagram illustrating a Multiple Input Multiple Output (MIMO) transceiver.

FIG. 1 is a block diagram illustrating a Multiple Input Multiple Output (MIMO) transceiver. In more detail, FIG. 1 shows an example of an OFDM or SC-FDMA (also called 'DFT spread OFDM' or 'DFT-s-OFDM') transceiver for supporting MIMO. In FIG. 1, if a Discrete Fourier Transform (DFT) block 108 is not present, the transceiver shown in FIG. 1 is an OFDM transceiver. If the DFT block 108 is present, the transceiver shown in FIG. 1 is an SC-FDMA transceiver. For convenience of description, description of FIG. 1 is based on the operations of a transmitter, and the order of operations of a receiver is in reverse order to that of the transmitter operations.

Referring to FIG. 1, a codeword-to-layer mapper 104 maps $N_C$ codewords 102 to $N_L$ layers 106. A codeword (CW) is equivalent to a transport block (TB) received from a Medium Access Control (MAC) layer. The relationship between the transport block (TB) and the codeword (CW) may be changed by codeword swapping. In general, the number of ranks for use in a communication system is identical to the number of layers. In the SC-FDMA transmitter, the DFT block 108 performs DFT conversion precoding for each layer 106. The precoding block 110 multiplies $N_L$ DFT-converted layers by a precoding vector/matrix. Through the above-mentioned process, the precoding block 110 maps $N_L$ DFT-converted layers to $N_T$ Inverse Fast Fourier Transform (IFFT) blocks 112 and $N_T$ antenna ports 114. The antenna port 114 may be re-mapped to actual physical antennas.

Figure 2:
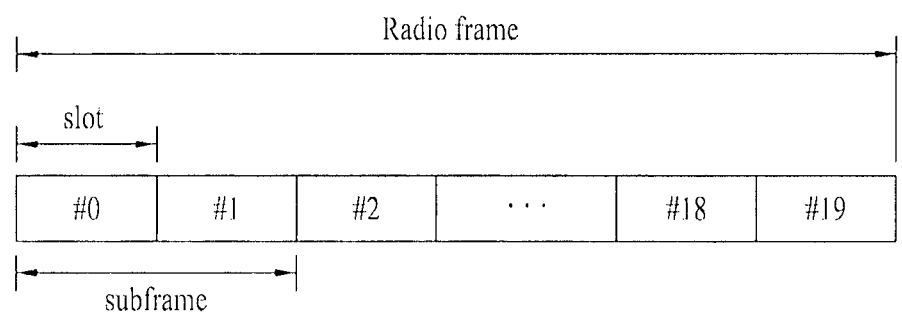
FIG. 2 exemplarily shows a radio frame structure.

FIG. 2 exemplarily shows a radio frame structure.

Referring to FIG. 2, a radio frame includes 10 subframes, and one subframe includes two slots in a time domain. A time required for transmitting one subframe is defined as a Transmission Time Interval (TTI). For example, one subframe may have a length of 1 ms and one slot may have a length of 0.5 ms. One slot may include a plurality of Orthogonal Frequency Division Multiplexing (OFDM) symbols or a Single Carrier Frequency Division Multiple Access (SC-FDMA) symbols in a time domain. Since the LTE system uses OFDMA in downlink and uses SC-FDMA in uplink, the OFDM or SC-FDMA symbol indicates one symbol duration. A resource block (RB) is a resource allocation unit and includes a plurality of contiguous carriers in one slot. The structure of the radio frame is only exemplary. Accordingly, the number of subframes included in the radio frame, the number of slots included in the subframe or the number of symbols included in the slot may be changed in various manners.

Figure 3:
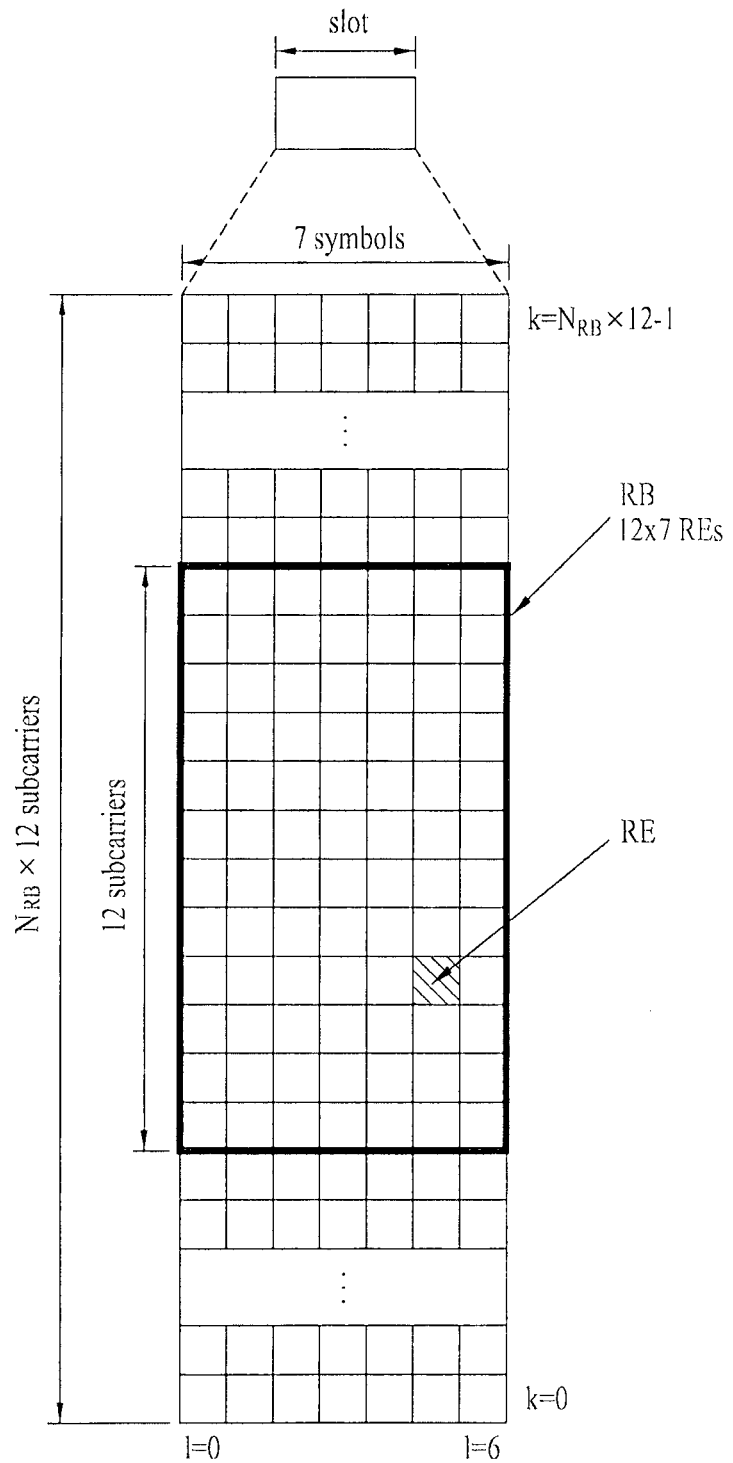
FIG. 3 exemplarily shows a resource grid of a downlink (DL) slot.

FIG. 3 exemplarily shows a resource grid of a downlink slot.

Referring to FIG. 3, a downlink slot includes a plurality of OFDM symbols in a time domain. One downlink slot includes 7 (or 6) OFDM symbols and a resource block (RB) includes 12 subcarriers in a frequency domain. Each element on a resource grid may be defined as a resource element (RE). One RB includes 12×7 (or 12×6) REs. The number ($N_{RB}$) of RBs contained in a downlink slot is dependent upon a downlink transmission bandwidth. An uplink slot structure is identical to the downlink slot structure, but OFDM symbols are replaced with SC-FDMA symbols in the uplink slot structure differently from the downlink slot structure.

Figure 4:
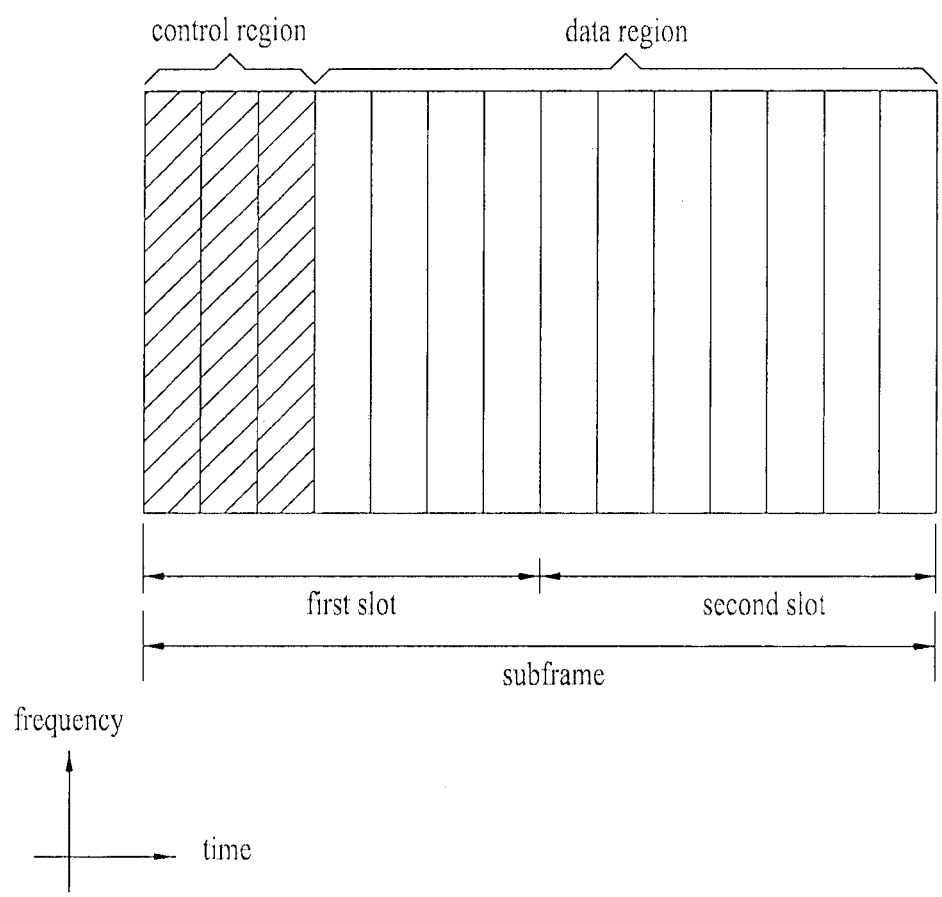
FIG. 4 is a downlink (DL) subframe structure.

FIG. 4 is a downlink subframe structure.

Referring to FIG. 4, a maximum of three (or four) OFDM symbols located in the front part of a first slot of the subframe may correspond to a control region to which a control channel is allocated. The remaining OFDM symbols correspond to a data region to which a Physical Downlink Shared CHannel (PDSCH) is allocated. A variety of downlink control channels may be used in the LTE, for example, a Physical Control Format Indicator Channel (PCFICH), a Physical Downlink Control Channel (PDCCH), a Physical hybrid ARQ indicator Channel (PHICH), etc. PCFICH is transmitted from a first OFDM symbol of the subframe, and carries information about the number of OFDM symbols used for transmitting a control channel within the subframe. PHICH carries a Hybrid Automatic Repeat request acknowledgment/negative-acknowledgment (HARQ ACK/NACK) signal as a response to an uplink transmission signal.

Control information transmitted over a PDCCH is referred to as Downlink Control Information (DCI). DCI includes resource allocation information for either a UE or a UE group and other control information. For example, DCI includes uplink/downlink (UL/DL) scheduling information, an uplink transmission (UL Tx) power control command, etc.

PDCCH carries a variety of information, for example, transmission format and resource allocation information of a downlink shared channel (DL-SCH), transmission format and resource allocation information of an uplink shared channel (UL-SCH), paging information transmitted over a paging channel (PCH), system information transmitted over the DL-SCH, resource allocation information of an upper-layer control message such as a random access response being transmitted over PDSCH, a set of Tx power control commands of each UE contained in a UE group, a Tx power control command, activation indication information of Voice over IP (VoIP), and the like. A plurality of PDCCHs may be transmitted within a control region. A user equipment (UE) can monitor a plurality of PDCCHs. PDCCH is transmitted as an aggregation of one or more contiguous control channel elements (CCEs). CCE is a logical allocation unit that is used to provide a coding rate based on a radio channel state to a PDCCH. CCE may correspond to a plurality of resource element groups (REGs). The format of PDCCH and the number of PDCCH bits may be determined according to the number of CCEs. A base station (BS) decides a PDCCH format according to DCI to be sent to the UE, and adds a Cyclic Redundancy Check (CRC) to control information. The CRC is masked with an identifier (e.g., Radio Network Temporary Identifier (RNTI)) according to a PDCCH owner or a purpose of the PDCCH. For example, provided that the PDCCH is provided for a specific UE, an identifier of the corresponding UE (e.g., cell-RNTI (C-RNTI)) may be masked with the CRC. If PDCCH is provided for a paging message, a paging identifier (e.g., paging-RNTI (P-RNTI)) may be masked with a CRC. If. PDCCH is provided for system information (e.g., system information block (SIC)), system information RNTI (SI-RNTI) may be masked with CRC. If PDCCH is provided for a random access response, random access-RNTI (RA-RNTI) may be masked with CRC. Control information transmitted over PDCCH is referred to as downlink control information (DCI). DCI includes resource allocation information for a UE or a UE group and other control information. For example, DCI includes UL/DL scheduling information, an uplink Tx power control command, etc.

Table 1 shows a DCI format 0 for uplink scheduling. In Table 1, although the size of the RB allocation field is denoted by 7 bits, the scope or spirit of the present invention is not limited thereto, the actual size of the RB allocation field can be changed according to system bandwidth.

TABLE 1

| Field | Bits | Comment |
| --- | --- | --- |
| Format | 1 | Uplink grant or downlink assignment |
| Hopping flag | 1 | Frequency hopping on/off |
| RB assignment | 7[a)] | Resource block assigned for PUSCH |
| MCS | 5 | Modulation scheme, coding scheme, etc. |
| New Data Indicator | 1 | Toggled for each new transport block |
| TPC | 2 | Power control of PUSCH |
| Cyclic shift for DMRS | 3 | Cyclic shift of demodulation reference signal |
| CQI request | 1 | To request CQI feedback through PUSCH |
| RNTI/CRC | 16 | 16 bit RNTI implicitly encoded in CRC |
| Padding | 1 | To ensure format 0 matches format 1A in size |
| Total | 38 | — |

* MCS: Modulation and Coding Scheme
* TPC: Transmit (Tx) Power Control
* RNTI: Radio Network Temporary Identifier
* CRC: Cyclic Redundancy Check Table 2 shows information of an MCS index for enabling the LTE to transmit uplink (UL) data. 5 bits are used for MCS. Three states ($I_{MCS}$=29~31) from among several states, each of which is capable of being denoted by 5 bits, are used for uplink (UL) retransmission.

TABLE 2

| MCS Index $I_{MCS}$ | Modulation Order $Q_m$ | TBS Index $I_{TBS}$ | Redundancy Version $rv_{idx}$ |
| --- | --- | --- | --- |
| 0 | 2 | 0 | 0 |
| 1 | 2 | 1 | 0 |
| 2 | 2 | 2 | 0 |
| 3 | 2 | 3 | 0 |
| 4 | 2 | 4 | 0 |
| 5 | 2 | 5 | 0 |
| 6 | 2 | 6 | 0 |
| 7 | 2 | 7 | 0 |
| 8 | 2 | 8 | 0 |
| 9 | 2 | 9 | 0 |
| 10 | 2 | 10 | 0 |
| 11 | 4 | 10 | 0 |
| 12 | 4 | 11 | 0 |
| 13 | 4 | 12 | 0 |
| 14 | 4 | 13 | 0 |
| 15 | 4 | 14 | 0 |
| 16 | 4 | 15 | 0 |
| 17 | 4 | 16 | 0 |
| 18 | 4 | 17 | 0 |
| 19 | 4 | 18 | 0 |
| 20 | 4 | 19 | 0 |
| 21 | 6 | 19 | 0 |
| 22 | 6 | 20 | 0 |
| 23 | 6 | 21 | 0 |
| 24 | 6 | 22 | 0 |
| 25 | 6 | 23 | 0 |
| 26 | 6 | 24 | 0 |
| 27 | 6 | 25 | 0 |
| 28 | 6 | 26 | 0 |
| 29 | reserved | | 1 |
| 30 | | | 2 |
| 31 | | | 3 |

Figure 5:
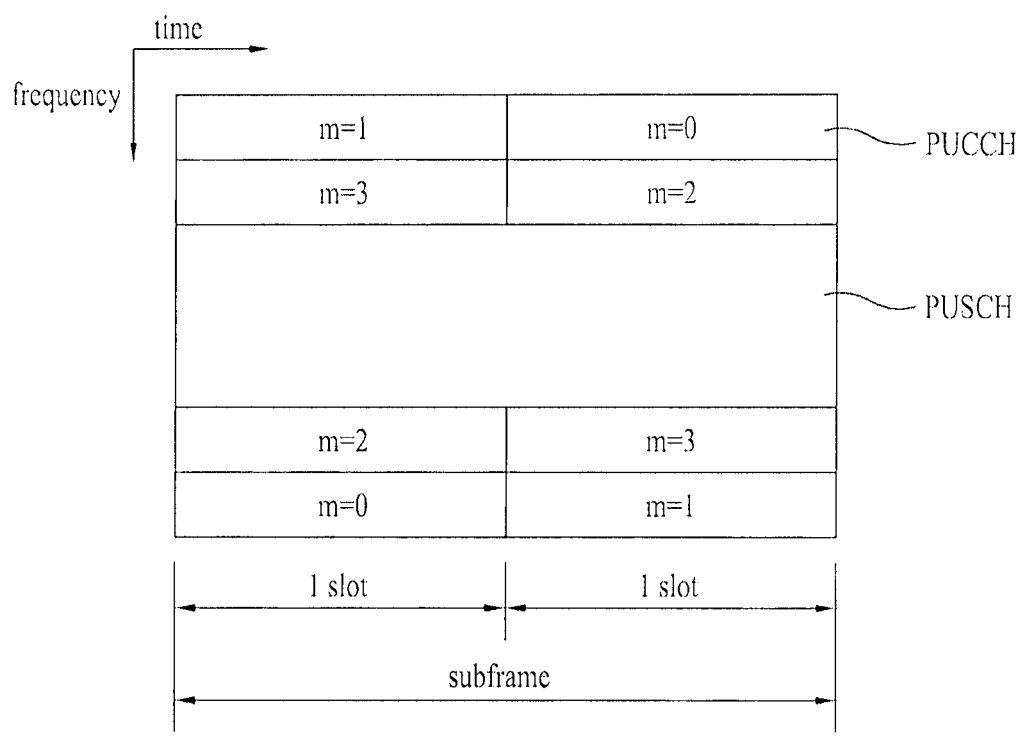
FIG. 5 is an uplink (UL) subframe structure.

FIG. 5 is an uplink subframe structure for use in the LTE.

Referring to FIG. 5, the UL subframe includes a plurality of slots (e.g., 2 slots). Each slot may include different numbers of SC-FDMA symbols according to CP length. The UL subframe is divided into a data region and a control region in a frequency domain. The data region includes PUCCH and transmits a data signal such as a voice signal or the like. The control region includes PUCCH, and transmits Uplink Control Information (UCI). PUCCH includes a pair of RBs (hereinafter referred to as an RB pair) located at both ends of the data region on a frequency axis, and is hopped using a slot as a boundary.

PUCCH may be used to transmit the following control information, i.e., Scheduling Request (SR), HARQ ACK/NACK, and a Channel Quality Indicator (CQI), and a detailed description thereof will hereinafter be described.

Scheduling Request (SR): Scheduling request (SR) is used for requesting UL-SCH resources, and is transmitted using an On-Off Keying (OOK) scheme.

HARQ ACK/NACK: HARQ ACK/NACK is a response signal to an uplink (UL) data packet on a PDSCH. The HARQ ACK/NACK indicates whether or not a DL data packet has been successfully received. ACK/NACK of 1 bit is transmitted as a response to a single DL codeword, and ACK/NACK of 2 bits is transmitted as a response to two DL codewords.

Channel Quality Indicator (CQI): CQI is feedback information for a downlink channel. MIMO-associated feedback information includes a Rank Indicator (RI) and a Precoding Matrix Indicator (PMI). 20 bits are used per subframe. The amount of control information (i.e., UCI), that is capable of being transmitted in a subframe by the UE, is dependent upon the number of SC-FDMAs available for UCI transmission. SC-FDMAs available in UCI transmission indicate the remaining SC-FDMA symbols other than SC-FDMA symbols that are used for Reference Signal (RS) transmission in a subframe. In the case of a subframe in which a Sounding Reference Signal (SRS) is established, the last SC-FDMA symbol of the subframe is also excluded. The Reference Signal (RS) is used for coherent detection of a PUCCH. PUCCH supports 7 formats according to transmission information.

Table 3 shows the mapping relationship between PUCCH format and UCI for use in LTE.

TABLE 3

| PUCCH Format | Uplink Control Information (UCI) |
|---|---|
| Format 1 | Scheduling request (SR) (unmodulated waveform) |
| Format 1a | 1-bit HARQ ACK/NACK with/without SR |
| Format 1b | 2-bit HARQ ACK/NACK with/without SR |
| Format 2 | CQI (20 coded bits) |
| Format 2 | CQI and 1- or 2-bit HARQ ACK/NACK (20 bits) for extended CP only |
| Format 2a | CQI and 1-bit HARQ ACK/NACK (20 + 1 coded bits) |
| Format 2b | CQI and 2-bit HARQ ACK/NACK (20 + 2 coded bits) |

In LTE-A, two methods may be used to simultaneously transmit UCI and UL-SCH data. A first method simultaneously transmits PUCCH and PUSCH. A second method multiplexes UCI to a PUSCH in the same manner as in the legacy LTE.

Since the legacy LTE UE is unable to simultaneously transmit PUCCH and PUSCH, it multiplexes UCI to a PUSCH region when UCI (e.g., CQI/PMI, HARQ-ACK, RI, etc.) transmission is needed for a subframe via which PUSCH is transmitted. For example, provided that CQI and/or PMI (CQI/PMI) transmission is needed for a subframe to which PUSCH transmission is allocated, the UE multiplexes UL-SCH data and CQI/PMI prior to DFT spreading, and then simultaneously transmits control information and data over PUSCH.

Figure 6:
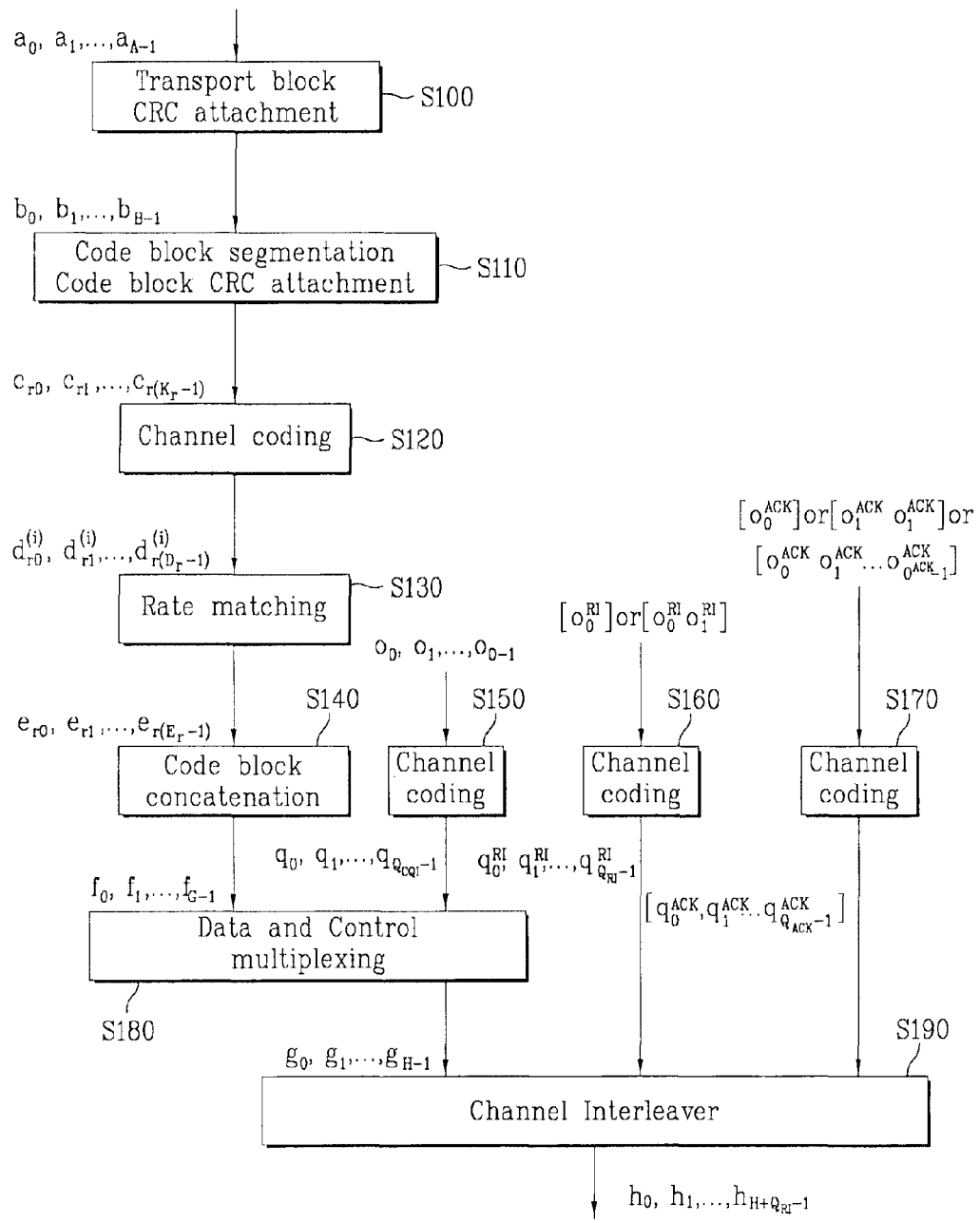
FIG. 6 is a flowchart illustrating a process for processing UL-SCH data and control information.

FIG. 6 is a flowchart illustrating a process for processing UL-SCH data and control information.

Referring to FIG. 6, error detection is provided to a UL-SCH transport block (TB) through Cyclic Redundancy Check (CRC) attachment at step S100.

All the transport blocks (TBs) are used to calculate CRC parity bits. Transport Block (TB) bits are denoted by $\alpha_0, \alpha_1, \alpha_2, \alpha_3 \ldots \alpha_{A-1}$. Parity bits are denoted by $p_0, p_1, p_2, p_3, \ldots p_{L-1}$. The size of TBs is denoted by A, and the number of parity bits is denoted by L.

After performing transport block (TB) CRC attachment, code block segmentation and code block CRC attachment are performed at step S110. Input bits for code block segmentation are denoted by $b_0, b_1, b_2, b_3, \ldots, b_{B-1}$, where B denotes the number of bits of a TB (including CRC). Bits provided after code block segmentation are denoted by $c_{r0}, c_{r1}, c_{r2}, c_{r3}, \ldots, c_{r(K_r-1)}$ where r denotes a code block number (r=0, 1, ..., C−1) Kr denotes the number of bits of a code block (r), and C denotes a total number of code blocks.

The channel coding is performed after performing the code block segmentation and code block CRC attachment at step S120. Bits after channel coding are denoted by $d_{r0}^{(i)}, d_{r1}^{(i)}, d_{r2}^{(i)}, d_{r3}^{(i)}, \ldots d_{r(D_r-1)}^{(i)}$, where i=0, 1, 2. $D_r$ is the number of bits of an i-th coded stream for the code block (r) (i.e., $D_r = K_r + 4$), r denotes a code block number (r=0, 1, ..., C−1), and Kr denotes the number of bits of a code block (r). C denotes a total number of code blocks. Turbo coding may be used for such channel coding.

Rate matching may be performed after the channel coding at step S130. Bits provided after rate matching are denoted by $e_{r0}, e_{r1}, e_{r2}, e_{r3}, \ldots, e_{r(E_r-1)}$. $E_r$ is the number of rate-matched bits of the r-th code block (where r=0, 1, ..., C−1), and C is a total number of code blocks.

Code block concatenation is performed after the rate matching at step S140. Bits provided after the code block concatenation are denoted by $f_0, f_1, f_2, f_3, \ldots f_{G-1}$ denotes a total number of bits coded for data transmission. If control information is multiplexed with UL-SCH transmission, bits used for control information transmission are not included in 'G'. $f_0, f_1, f_2, f_3, \ldots f_{G-1}$ may correspond to UL-SCH codewords.

In the case of UL control information, channel quality information (CQI and/or PMI), RI and HARQ-ACK are independently channel-coded. UCI channel coding is performed on the basis of the number of coded symbols for each piece of control information. For example, the number of coded symbols may be used for rate matching of the coded control information. In a subsequent process, the number of coded symbols may correspond to the number of modulation symbols or the number of REs.

Channel coding of channel quality information is performed using an input bit sequence $o_0, o_1, o_2, o_3, \ldots o_{O-1}$ at step S150. The output bit sequence of the channel coding for channel quality information is denoted by $q_0, q_1, q_2, q_3, \ldots, q_{Q_{CQI}-1}$. Channel quality information uses different channel coding schemes according to the number of bits. In addition, if channel quality information is composed of 11 bits or more, a CRC bit is attached to the channel quality information. $Q_{CQI}$ is a total number of coded bits. In order to set the length of a bit sequence to $Q_{CQI}$, the coded channel quality information may be rate-matched. $Q_{CQI}$ is denoted by $Q_{CQI} = Q'_{CQI} \times Q_m$, $Q'_{CQI}$ is the number of coded symbols for a CQI, $Q_m$ is a modulation order, and $Q_m$ is set to be identical to a modulation order of UL-SCH data.

Channel coding of RI is performed using an input bit sequence $[o_0^{RI}]$ or $[o_0^{RI}\ o_1^{RI}]$ at step S160. $[o_0^{RI}]$ and $[o_0^{RI}\ o_1^{RI}]$ denote 1-bit RI and 2-bit RI, respectively.

In the case of the 1-bit RI, repetition coding is used. In the case of the 2-bit RI, the (3,2) simplex code is used, and the encoded data may be cyclically repeated.

Table 4 exemplarily shows channel coding of the 1-bit RI, and Table 5 exemplarily shows channel coding.

TABLE 4

| $Q_m$ | Encoded RI |
|---|---|
| 2 | $[o_0^{RI}\ y]$ |
| 4 | $[o_0^{RI}\ y\ x\ x]$ |
| 6 | $[o_0^{RI}\ y\ x\ x\ x\ x]$ |

TABLE 5

| $Q_m$ | Encoded RI |
|---|---|
| 2 | $[o_0^{RI}\ o_1^{RI}\ o_2^{RI}\ o_0^{RI}\ o_1^{RI}\ o_2^{RI}]$ |
| 4 | $[o_0^{RI}\ o_1^{RI}\ x\ x\ o_2^{RI}\ x\ x\ o_0^{RI}\ o_1^{RI}\ x\ x\ o_2^{RI}\ x\ x]$ |
| 6 | $[o_0^{RI}\ o_1^{RI}\ x\ x\ x\ x\ o_2^{RI}\ x\ x\ x\ x\ o_0^{RI}\ x\ x\ x\ x\ o_1^{RI}\ o_2^{RI}\ x\ x\ x\ x]$ |

In Tables 4 and 5, $Q_m$ is a modulation order. $o_2^{RI}$ is denoted by $o_2^{RI} = (o_0^{RI} + o_1^{RI}) \bmod 2$, and 'mod' is a modulo operation. 'x' or 'y' is a place holder for maximizing a Euclidean distance of a modulation symbol carrying RI information when the RI bit is scrambled. Each of 'x' and 'y' has the value of 0 or 1. The output bit sequence $q_0^{RI}, q_1^{RI}, q_2^{RI}, \ldots, q_{Q_{RI}-1}^{RI}$ is obtained by a combination of coded RI block(s). $Q_{RI}$ is a total number of coded bits. In order to set the length of coded RI to $Q_{RI}$, the finally-combined coded RI block may be a part not the entirety (i.e., rate matching). $Q_{RI}$ is denoted by $Q_{RI}=Q'_{RI} \times Q_m$, $Q'_{RI}$ is the number of coded symbols for RI, and $Q_m$ is a modulation order. $Q_m$ is established to be identical to a modulation order of UL-SCH data.

The channel coding of HARQ-ACK is performed using the input bit sequence $[o_0^{ACK}]$, $[o_0^{ACK} \; o_1^{ACK}]$, or $[o_0^{ACK} \; o_1^{ACK} \ldots o_{O^{ACK}-1}^{ACK}]$. $[o_0^{ACK}]$ and $[o_0^{ACK} \; o_1^{ACK}]$ denote 1-bit HARQ-ACK and 2-bit HARQ-ACK. In addition, $[o_0^{ACK} \; o_1^{ACK} \ldots o_{O^{ACK}-1}^{ACK}]$ denotes HARQ-ACK composed of two or more bits (i.e., $O^{ACK}>2$). ACK is encoded to 1, and NACK is encoded to 0. In the case of 1-bit HARQ-ACK, repetition coding is used. In the case of 2-bit HARQ-ACK, the (3,2) simplex code is used, and encoded data may be cyclically repeated.

Table 6 exemplarily shows channel coding of HARQ-ACK. Table 7 exemplarily shows channel coding of 2-bit HARQ-ACK.

TABLE 6

| $Q_m$ | Encoded HARQ-ACK |
|---|---|
| 2 | $[o_0^{ACK} \; y]$ |
| 4 | $[o_0^{ACK} \; y \; x \; x]$ |
| 6 | $[o_0^{ACK} \; y \; x \; x \; x \; x]$ |

TABLE 7

| $Q_m$ | Encoded HARQ-ACK |
|---|---|
| 2 | $[o_0^{ACK} \; o_1^{ACK} \; o_2^{ACK} \; o_0^{ACK} \; o_1^{ACK} \; o_2^{ACK}]$ |
| 4 | $[o_0^{ACK} \; o_1^{ACK} \; x \; x \; o_2^{ACK} \; o_0^{ACK} \; x \; x \; o_1^{ACK} \; o_2^{ACK} \; x \; x]$ |
| 6 | $[o_0^{ACK} \; o_1^{ACK} \; x \; x \; x \; x \; o_2^{ACK} \; o_0^{ACK} \; x \; x \; x \; x \; o_1^{ACK} \; o_2^{ACK} \; x \; x \; x \; x]$ |

In Tables 6 and 7, $Q_m$ is a modulation order. For example, $Q_m=2$ may correspond to QPSK, $Q_m=4$ may correspond to 16QAM, and $Q_m=6$ may correspond to 64QAM. $o_0^{ACK}$ may correspond to an ACK/NACK bit for a codeword 0, and $o_1^{ACK}$ may correspond to an ACK/NACK bit for a codeword 1. $o_2^{ACK}$ is denoted by $o_2^{ACK}=(o_0^{ACK}+o_1^{ACK}) \bmod 2$, and 'mod' is a modulo operation. 'x' or 'y' is a place holder for maximizing a Euclidean distance of a modulation symbol carrying HARQ-ACK information when the HARQ-ACK bit is scrambled. Each of 'x' and 'y' has the value of 0 or 1. $Q_{ACK}$ is a total number of coded bits, the bit sequence $q_0^{ACK}, q_1^{ACK}, q_2^{ACK}, \ldots, q_{Q_{ACK}-1}^{ACK}$ is obtained through a combination of coded HARQ-ACK block(s). In order to set the length of the bit sequence to $Q_{ACK}$, the finally-combined HARQ-ACK block may be a part not the entirety (i.e., rate matching). $Q_{ACK}$ is denoted by $Q_{ACK}=Q'_{ACK} \times Q_m$, $Q'_{ACK}$ is the number of coded symbols for HARQ-ACK, $Q_m$ is a modulation order. $Q_m$ is established to be identical to a modulation order of UL-SCH data.

The inputs of a data and control multiplexing block (also called 'data/control multiplexing block') are coded UL-SCH bits denoted by $f_0, f_1, f_2, f_3, \ldots, f_{G-1}$ and coded CQI/PMI bits denoted by $q_0, q_1, q_2, q_3, \ldots, q_{Q_{CQI}-1}$ at step S180. The outputs of the data and control multiplexing block are denoted by $g_0, g_1, g_2, g_3, \ldots, g_{H'-1}$. $g_i$ is a column vector of the length $Q_m$ (where $i=0, \ldots, H'-1$). H' is denoted by $H'=H/Q_m$, and H is denoted by $H=(G+Q_{CQI})$. H is the total number of coded bits allocated for UL-SCH data and CQI/PMI data. The input of a channel interleaver includes output data $g_0, g_1, g_2, \ldots, g_{H'-1}$ of the data and control multiplexing block, the encoded rank indicators $q_0^{RI}, q_1^{RI}, q_2^{RI}, \ldots, q_{Q'_{RI}-1}^{RI}$, and coded HARQ-ACK data $q_0^{ACK}, q_1^{ACK}, q_2^{ACK}, \ldots, q_{Q'_{-1}}^{ACK}$ at step S190. $g_i$ is a column vector of length $Q_m$ for CQI/PMI (where $i=0, \ldots, H-1$, and H' is denoted by $H'=H/Q_m$), and $q_i^{ACK}$ is a column vector of length $Q_m$ for ACK/NACK (where $i=0, \ldots, Q'_{ACK-1}$, and $Q'_{ACK}=Q_{ACK}/Q_m$). $q_i^{RI}$ is a column vector of length $Q_m$ for RI (where $i=0, \ldots, Q'_{RI}-1$, and $Q'_{RI}=Q/Q_m$).

The channel interleaver multiplexes control information and UL-SCH data for PUSCH transmission. In more detail, the channel interleaver includes a process of mapping control information and UL-SCH data to a channel interleaver matrix corresponding to PUSCH resources.

Figure 7:
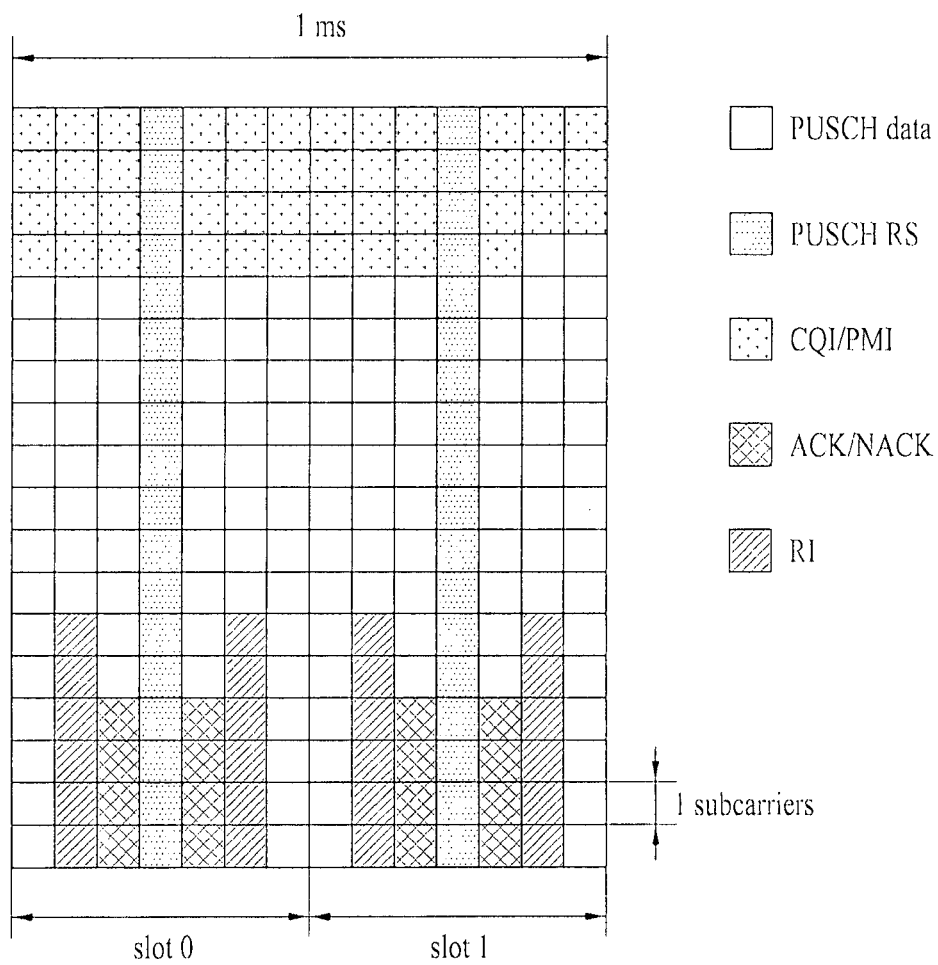
FIG. 7 is a conceptual diagram illustrating that control information and UL-SCH data are multiplexed on a Physical Uplink Shared CHannel (PUSCH).

After execution of channel interleaving, the bit sequence $h_0, h_1, h_2, \ldots, h_{H+Q_m-1}$ that is read row by row from the channel interleaver matrix is then output. The read bit sequence is mapped on a resource grid. $H''=H'+Q'_{RI}$ modulation symbols are transmitted through a subframe. FIG. 7 is a conceptual diagram illustrating that control information and UL-SCH data are multiplexed on a PUSCH. When transmitting control information in a subframe to which PUSCH transmission is allocated, the UE simultaneously multiplexes control information (UCI) and UL-SCH data prior to DFT spreading. The control information (UCI) includes at least one of CQI/PMI, HARQ ACK/NACK and RI. The number of REs used for transmission of each of CQI/PMI, ACK/NACK and RI is dependent upon Modulation and Coding Scheme (MCS) and offset values ($\Delta_{offset}^{CQI}, \Delta_{offset}^{HARQ-ACK}, \Delta_{offset}^{RI}$) assigned for PUSCH transmission. The offset values allow different coding rates according to control information, and are semi-statically established by an upper layer (e.g., RRC) signal. UL-SCH data and control information are not mapped to the same RE. Control information is mapped to be contained in two slots of the subframe. A base station (BS) can pre-recognize control transmission to be transmitted over PUSCH, such that it can easily demultiplex control information and a data packet.

Referring to FIG. 7, CQI and/or PMI (CQI/PMI) resources are located at the beginning part of UL-SCH data resources, are sequentially mapped to all SC-FDMA symbols on one subcarrier, and are finally mapped in the next subcarrier. CQI/PMI is mapped from left to right within each subcarrier (i.e., in the direction of increasing SC-FDMA symbol index). PUSCH data (UL-SCH data) is rate-matched in consideration of the amount of CQI/PMI resources (i.e., the number of encoded symbols). The modulation order identical to that of UL-SCH data may be used in CQI/PMI. If the CQI/PMI information size (payload size) is small (e.g., 11 bits or less), the CQI/PMI information may use the (32, k) block code in a similar manner to PUCCH transmission, and the encoded data may be cyclically repeated. If CQI/PMI information is small in size, CRC is not used. If CQI/PMI information is large in size (e.g., 11 bits or higher), 8-bit CRC is added thereto, and channel coding and rate matching are performed using a tail-biting convolutional code. ACK/NACK is inserted into some resources of the SC-FDMA mapped to UL-SCH data through puncturing. ACK/NACK is located close to RS, fills the corresponding SC-FDMA symbol from bottom to top (i.e., in the direction of increasing subcarrier index) within the SC-FDMA symbol. In case of a normal CP, the SC-FDMA symbol for ACK/NACK is located at SC-FDMA symbols (#2/#4) in each slot as can be seen from FIG. 7. Irrespective of whether ACK/NACK is actually transmitted in a subframe, the encoded RI is located next to the symbol for ACK/NACK. Each of ACK/NACK, RI and CQI/PMI is independently encoded.

In LTE, control information (e.g., QPSK modulated) may be scheduled in a manner that the control information can be transmitted over PUSCH without UL-SCH data. Control information (CQI/PMI, RI and/or ACK/NACK) is multiplexed before DFT spreading so as to retain low CM (Cubic Metric) single-carrier characteristics. Multiplexing of ACK/NACK, RI and CQI/PMI is similar to that of FIG. 7. The SC-FDMA symbol for ACK/NACK is located next to RS, and resources mapped to the CQI may be punctured. The number of REs for ACK/NACK and the number of REs for RI are dependent upon reference MCS (CQI/PMI MCS) and offset parameters ($\Delta_{offset}^{CQI}$, $\Delta_{offset}^{HARQ-ACK}$, and $\Delta_{offset}^{RI}$). The reference MCS is calculated on the basis of CQI payload size and resource allocation. Channel coding and rate matching to implement control signaling having no UL-SCH data are identical to those of the other control signaling having UL-SCH data.

If UCI is transmitted over PUSCH, the UE must determine the number $Q'_{UCI}$ of encoded symbols for UCI so as to perform channel coding (See S150, S160 and S170 of FIG. 6). The number $Q'_{UCI}$ of encoded symbols is adapted to calculate a total number ($Q_{UCI}=Q_m \cdot Q'_{UCI}$) of encoded bits. In case of CQI/PMI and RI, the number of encoded symbols may also be used for rate matching of UL-SCH data. $Q_m$ is a modulation order. In the case of LTE, a modulation order of UCI is established to be identical to a modulation order of UL-SCH data. In a subsequent process, the number ($Q'_{UCI}$) of encoded symbols may correspond to the number of modulation symbols or the number of REs multiplexed on PUSCH. Therefore, according to the present invention, the number ($Q'_{UCI}$) of encoded symbols may be replaced with the number of (encoded) modulation symbols or the number of REs.

A method for deciding the number (Q') of encoded symbols for UCI in legacy LTE will hereinafter be described using CQI/PMI as an example. Equation 1 indicates an equation defined in LTE.

[Equation 1]

$$Q' = \min\left((1)\left\lceil \frac{(O+L) \cdot M_{sc}^{PUSCH-initial} \cdot N_{symb}^{PUSCH-initial} \cdot \beta_{offset}^{PUSCH}}{\sum_{r=0}^{C-1} K_r} \right\rceil, (2)M_{sc}^{PUSCH} \cdot N_{symb}^{PUSCH} - \frac{Q_{RI}}{Q_m}\right)$$

In Equation 1, 'O' denotes the number of CQI/PMI bits, and 'L' denotes the number of CRC bits. If 'O' is equal to or less than 11, L is set to 0. If 'O' is higher than 12, L is set to 8. $Q_{CQI}$ is denoted by $Q_{CQI}=Q_m \cdot Q'$, and $Q_m$ is a modulation order. $Q_{RI}$ denotes the number of encoded RI bits. If RI is not transmitted, Q, is set to 0 ($Q_{RI}=0$). $\beta_{offset}^{PUSCH}$ denotes an offset value, and may be adapted to adjust the coding rate of CQI/PMI. $\beta_{offset}^{PUSCH}$ may also be denoted by $\beta_{offset}^{PUSCH}=\beta_{offset}^{CQI}$. $M_{sc}^{PUSCH-initial}$ is a band that is scheduled for initial PUSCH transmission of a transport block (TB). $N_{symb}^{PUSCH-initial}$ is the number of SC-FDMA symbols for each subframe for initial PUSCH transmission of the same transport block (TB), and may also be denoted by $N_{symb}^{PUSCH-initial}=(2\cdot(N_{symb}^{UL}-1)-N_{SRS})$. $N_{symb}^{UL}$ denotes the number of SC-FDMA symbols for each slot, $N_{SRS}$ is 0 or 1. In the case where the UE is configured to transmit PUSCH and SRS in a subframe for initial transmission or in the case where PUSCH resource allocation for initial transmission partially or entirely overlaps with a cell-specific SRS subframe or band, $N_{SRS}$ is set to 1. Otherwise, $N_{SRS}$ is set to 0.

$$\sum_{r=0}^{C-1} K_r$$

denotes the number of bits of data payload (including CRC) for initial PUSCH transmission of the same transport block (TB). C is a total number of code blocks, r is a code block number, and $K_r$ is the number of bits of a code block (r). $M_{sc}^{PUSCH-initial}$, C, and $K_r$ are obtained from initial PDCCH for the same transport block (TB). $\lceil n \rceil$ is a ceiling function, and returns the smallest integer from among at least n values. 'min(a,b)' returns the smallest one of 'a' and 'b'

The part (2) for an upper limit is removed from Equation 1, but only the part (1) can be represented by the following equation 2.

[Equation 2]

$$Q' = \left\lceil \frac{(O+L)}{1} \cdot \frac{1}{\sum_{r=0}^{C-1} K_r / M_{sc}^{PUSCH-initial} \cdot N_{symb}^{PUSCH-initial}} \cdot \beta_{offset}^{PUSCH} \right\rceil$$

$$= \left\lceil \frac{Payload_{UCI}}{1} \cdot \frac{1}{Payload_{Data}/N_{RE\_PUSCH_{initial}}} \cdot \beta_{offset}^{PUSCH} \right\rceil$$

In Equation 2, $Payload_{UCI}$ is the sum of the number (O) of UCI bits and the number (L) of CRC bits (i.e., $Payload_{UCI}=O+L$). In legacy LTE, if UCI is ACK/NACK or RI, the number (L) of CRC bits is set to 0. If UCI is CQI/PMI and the CQI/PMI is composed of 11 bits or less, L is set to 0 (i.e., L=0). Otherwise, if UCI is CQI/PMI and the CQI/OMI is composed of 12 bits or higher, L is set to 8 (i.e., L=8). $Payload_{Data}$ is the number of bits of data payload (including CRC) for initial PUSCH transmission recognized through either initial PDCCH or a random access response grant for the same transport block (TB). $N_{RE\_PUSCH_{initial}}$ is the number of REs allocated to PUSCH for initial transmission of the same transport block (TB) (corresponding to $N_{sc}^{PUSCH-initial} \cdot N_{symb}^{PUSCH-initial}$). $\beta_{offset}^{PUSCH}$ is an offset value for adjusting the coding rate of UCI. $\beta_{offset}^{PUSCH}$ may be determined on the basis of a given offset value (e.g., $\Delta_{offset}^{CQI}$, $\Delta_{offset}^{HARQ-ACK}$, $\Delta_{offset}^{RI}$) for each UCI.

In Equation 2, $Payload_{Data}/N_{RE\_PUSCH_{initial}}$ is a Spectral Efficiency (SE) for initial PUSCH transmission of the same transport block (TB). That is, the SE may indicate the ratio of the size of resources physically used by specific information to information to be transmitted. The unit of SE is bit/symbol/subcarrier or bit/RE, and corresponds to a bit/second/Hz acting as a general SE unit. The SE can be understood as the number of data bits allocated to one PUSCH RE so as to perform initial PUSCH transmission of the same transport block (TB). Equation 2 reuses SE of UL-SCH data so as to calculate the number of coded symbols of UCI, and uses an offset value to adjust the coding rate. In the legacy LTE, when PUCCH is piggybacked, a modulation order ($Q_m$) of UCI is established to be identical to a modulation order ($Q_m$) of data. Under this condition, Equation 2 can be represented by the following equation 3.

[Equation 3]

$$Q' = \left\lceil \frac{Payload_{UCI}}{1} \cdot \frac{1}{Payload_{Data}/N_{RE\_PUSCH_{initial}}} \cdot \beta_{offset}^{PUSCH} \right\rceil$$
$$= \left\lceil \frac{Payload_{UCI}}{Q_m} \cdot \frac{1}{Payload_{Data}/Q_m \cdot N_{RE\_PUSCH_{initial}}} \cdot \beta_{offset}^{PUSCH} \right\rceil$$

In Equation 3, $Payload_{Data}/Q_m \cdot N_{RE\_PUSCH_{initial}}$ is the ratio of the number ($Payload_{Data}$) of bits (including CRC) of data payload for initial PUSCH transmission of the same transport block (TB) to the number ($Q_m \cdot N_{RE\_PUSCH_{initial}}$) of bits allocated to a PUSCH for initial transmission of the same transport block (TB). $Payload_{Data}/Q_m \cdot N_{RE\_PUSCH_{initial}}$ may approximate to a spectral efficiency (SE) of initial transmission of the same transport block (TB).

In the present invention, SE is a spectral efficiency $SE_{Data}$) for UL-SCH data (i.e., a transport block (TB)) in so far as the SE is not mentioned specially in a different manner. SE may also denote $Payload_{Data}/N_{RE\_PUSCH_{initial}}$ or $Payload_{Data}/Q_m \cdot N_{RE\_PUSCH_{initial}}$ according to context.

In the case of HARQ-ACK, L is set to 0 (i.e., L=0), $\beta_{offset}^{PUSCH}$ is set to $\beta_{offset}^{PUSCH-ACK}$ (i.e., $\beta_{offset}^{PUSCH}=\beta_{offset}^{HARQ-ACK}$), and the number of coded symbols is determined in the same manner as in Equation 1 other than the part (2) indicating the upper limit. Similarly, in the case of RI, L is set to 0 (i.e., L=0), is set to $\beta_{offset}^{RI}$ (i.e., $\beta_{offset}^{PUSCH}=\beta_{offset}^{RI}$), and the number of coded symbols is determined in the same manner as in Equation 1 other than the part (2) indicating the upper limit.

The above-mentioned description may be applied only when one codeword (corresponding to a TB) is transmitted over a PUSCH, because the legacy LTE does not support a single user (SU)-MIMO. However, LTE-A supports SU-MIMO, so that several codewords can be transmitted over a PUSCH. Therefore, a method for multiplexing a plurality of codewords and UCI is needed.

A method for effectively multiplexing several pieces of data and UCI in a PUSCH will hereinafter be described with reference to the annexed drawing. For convenience of description, although UL-SCH transmission will be described on the basis of a codeword, a transport block (TB) and a codeword are equivalent data blocks. Therefore, the equivalent data blocks may be commonly known as 'UL-SCH data block'. In addition, the codeword may be replaced with a corresponding transport block (TB), or vice versa. The relationship between the codeword and the transport block (TB) may be changed by codeword swapping. For example, a first TB and a second TB may correspond to a first codeword and a second codeword, respectively. On the other hand, if codeword swapping is applied, the first TB may correspond to the second codeword, and the second TB may correspond to the first codeword. The HARQ operation is performed on the basis of a transport block (TB). The following embodiments may be implemented independently or collectively.

Embodiment 1A

UCI is Multiplexed to One Codeword Through Codeword Selection

In accordance with the present invention, when two or more codewords are transmitted, UCI is multiplexed to a layer via which a specific codeword is transmitted so that the multiplexed result is transmitted. Preferably, a specific codeword may be selected according to information of a new data indicator (NDI) capable of discriminating between new transmission (or initial transmission) and retransmission. UCI is multiplexed to all or some of a layer via which the corresponding codeword is transmitted.

For example, in the case where two codewords are all in new transmission (or initial transmission), UCI may be multiplexed to a layer via which a first codeword (or a transport block TB) is transmitted. In another example, in the case where one of two codewords corresponds to new transmission and the other one corresponds to retransmission (i.e., a codeword of new transmission and a codeword of retransmission are mixed), UCI may be multiplexed to a layer via which a codeword of new transmission is transmitted. Preferably, the size of resources (e.g., the number of REs) (corresponding to the number of modulation symbols or the number of coded symbols) where the UCI is multiplexed may be decided according to the number of REs via which the corresponding codeword is transmitted, the modulation scheme/order, the number of bits of data payload, and an offset value. Preferably, in order for UCI resources to be determined to be an MCS (Modulation and Coding Scheme) function of the corresponding codeword, UCI can be multiplexed to all layers for transmitting the corresponding codeword.

In the case where the new transmission and the retransmission are present, the reason why the UCI is multiplexed to the codeword corresponding to the new transmission is as follows. In HARQ initial transmission, a data transport block size (TBS) of a PUSCH is established to satisfy a target Frame Error Rate (FER) (e.g., 10%). Therefore, when data and UCI are multiplexed and transmitted, the number of REs for the UCI is defined as a function of the number of REs allocated for transmission of both a data TBS and a PUSCH, as shown in Equation 2. On the other hand, when UCI is multiplexed to a PUSCH retransmitted by HARQ, the UCI can be multiplexed using a parameter having been used for initial PUSCH transmission. In order to reduce resource consumption during transport block (TB) retransmission, the BS may allocate a smaller amount of PUSCH resources as compared to the initial transmission, such that there may arise an unexpected problem when the size of UCI resources is decided by a parameter corresponding to retransmission. Accordingly, in the case where HARQ retransmission occurs, the size of UCI resources may be determined using a parameter used for initial PUSCH transmission. However, assuming that there is a high difference in channel environment between initial transmission and retransmission in association with the same codeword, transmission quality of UCI may be deteriorated when the size of UCI resources is decided using the parameter used for initial PUSCH transmission. Therefore, the retransmission codeword and the initial transmission codeword are simultaneously transmitted, UCI is multiplexed to an initial transmission codeword, so that the amount of UCI resources can be adaptively changed even when the channel environment is changed.

In another example, if all codewords correspond to retransmission, two methods can be used. A first method can be implemented by multiplexing a UCI to a first codeword (or TB). A second method can be implemented by multiplexing a UCI to a codeword to which the latest UCI was multiplexed. In this case, the amount of UCI resources can be calculated using either information of a codeword related to the latest initial transmission or information of a codeword that has been retransmitted the smallest number of times, such that UCI resources can be most appropriately adapted to channel variation.

Embodiment 1B

UCI is Multiplexed to One Codeword Through Codeword Selection

In accordance with embodiment 1B, in the case where one of two codewords corresponds to new transmission, and the other one corresponds to retransmission (i.e., a new transmission codeword and a retransmission codeword are mixed), UCI may be multiplexed to a layer via which the retransmission codeword is transmitted. In the case of using a successive interface cancellation (SIC) receiver, a retransmission codeword having a high possibility of causing rapid termination is first decoded and at the same time that UCI is decoded, and interference affecting the new transmission codeword can be removed using the decoded retransmission codeword. Provided that the base station (BS) uses the SIC receiver, if UCI is multiplexed to a layer via which the new transmission codeword is transmitted (See Embodiment 1A), latency for enabling the BS to read UCI may be unavoidably increased. The method shown in the embodiment 1B can be implemented by multiplexing UCI to a firstly decoded codeword on the condition that the SIC receiver can recognize the firstly decoded codeword. On the other hand, provided that UCI is transmitted to a layer via which a new transmission codeword is transmitted under the condition that new transmission and retransmission are mixed, information corresponding to retransmission is first decoded, and interference is removed from the layer via which the new transmission codeword is transmitted, thereby improving UCI detection performance.

If the UCI is multiplexed to a specific codeword, the corresponding codeword can be transmitted to a plurality of layers, so that UCI can also be multiplexed to a plurality of layers.

Equation 4 exemplarily shows a method for calculating the number (Q') of coded symbols for UCI under the condition that the UCI is multiplexed to one specific codeword.

[Equation 4]

$$Q' = \left\lceil Payload_{UCI} \cdot \frac{1}{SE_{Data}/L_{Data}} \cdot \beta_{offset}^{PUSCH} \right\rceil$$

$$= \left\lceil \frac{Payload_{UCI}}{1} \cdot \frac{1}{Payload_{Data}/L_{Data} \cdot N_{RE\_PUSCH_{initial}}} \cdot \beta_{offset}^{PUSCH} \right\rceil$$

$$= \left\lceil \frac{Payload_{UCI} \cdot L_{Data} \cdot N_{RE\_PUSCH_{initial}} \cdot \beta_{offset}^{PUSCH}}{Payload_{Data}} \right\rceil$$

In Equation 4, $SE_{Data}$ is a spectral efficiency (SE), and is given as $Payload_{Data}/N_{Re\_PUSCH_{initial}}$. $Payload_{UCI}$, $Payload_{Data}$, $N_{Re\_PUSCH_{initial}}$ and $\beta_{offset}^{PUSCH}$ are defined in Equation 2. $L_{Data}$ is an integer of 1 or higher, and denotes the number of layers for the same transport block (TB) (or corresponding codeword). UCI includes CQI/PMI, HARQ ACK/NACK or RI.

Equation 4 is characterized in that a payload size of a codeword via which UCI is multiplexed, the number of REs via which the corresponding codeword is transmitted, and the number ($L_{Data}$) of layers via which the corresponding codeword is transmitted are used to decide the number of encoded symbols for UCI. In more detail, the number of layers for UCI multiplexing is multiplied by the number of time-frequency resource elements (REs), such that a total number of time-frequency-space REs can be applied to the process of calculating UCI resources.

Figure 8:
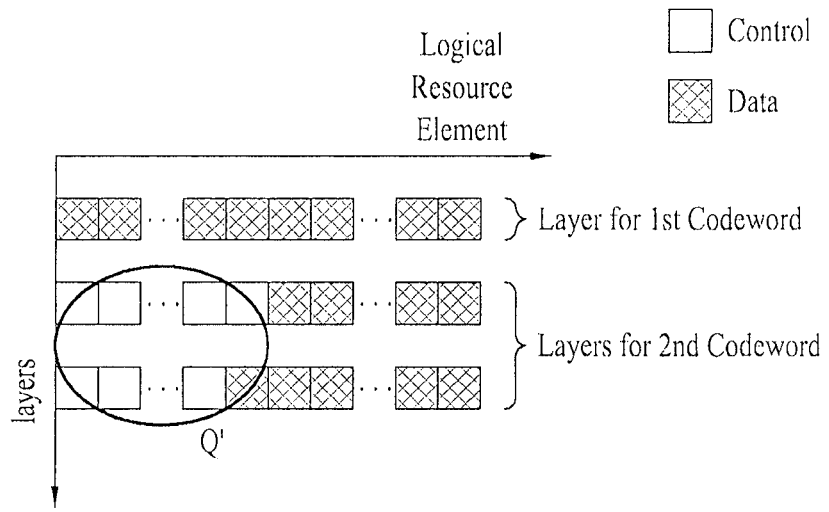
FIGS. 8 and 9 illustrate that Uplink Control Information (UCI) is multiplexed to one specific codeword according to one embodiment of the present invention.

FIG. 8 shows an example in which UCI is multiplexed to one specific codeword using the number of encoded symbols obtained from Equation 4. The method of FIG. 8 can effectively use PUSCH resources by multiplexing UCI using only the number of resources requisite for each layer. In the example of FIG. 8, it is assumed that UCI is multiplexed to a second codeword. Referring to FIG. 8, the amounts of UCI resources multiplexed to respective layers are different from each other.

Equation 5 exemplarily shows another method for calculating the number (Q') of encoded symbols for UCI when the UCI is multiplexed to one specific codeword.

[Equation 5]

$$Q' = L_{UCI} \cdot \left\lceil \frac{Payload_{UCI}}{1} \cdot \frac{1}{SE_{data}} \cdot \beta_{offset}^{PUSCH} \right\rceil$$

$$= L_{UCI} \cdot \left\lceil \frac{Payload_{UCI}}{1} \cdot \frac{1}{Payload_{Data}/N_{RE\_PUSCH_{initial}}} \cdot \beta_{offset}^{PUSCH} \right\rceil$$

$$= L_{UCI} \cdot \left\lceil \frac{Payload_{UCI}}{Q_m} \cdot \frac{1}{Payload_{Data}/Q_m \cdot N_{RE\_PUSCH_{initial}}} \cdot \beta_{offset}^{PUSCH} \right\rceil$$

$$= L_{UCI} \cdot \left\lceil \frac{Payload_{UCI} \cdot N_{RE\_PUSCH_{initial}} \cdot \beta_{offset}^{PUSCH}}{Payload_{Data}} \right\rceil$$

In Equation 5, $SE_{Data}$ denotes a spectral efficiency (SE), and is given as $Payload_{Data}/N_{Re\_PUSCH_{initial}}$ or $Payload_{Data}/N_{Re\_PUSCH_{initial}}$. $Q_m$ is a modulation order. Although Equation 5 shows that $Q_m$ for UCI is identical to $Q_m$ for data, it should be noted that $Q_m$ for UCI and $Q_m$ for data may also be given independent of each other. $Payload_{UCI}$, $Payload_{Data}$, $N_{Re\_PUSCH_{initial}}$, $Q_m$ and $\beta_{offset}^{PUSCH}$ shown in Equation 5 are the same as those of Equation 2. $L_{UCI}$ is an integer of 1 or higher, and denotes the number of layers in which UCI is multiplexed. UCI includes CQI/PMI, HARQ ACK/NACK or RI.

In the same manner as in Equation 4, Equation 5 is also characterized in that a payload size of a codeword via which UCI is multiplexed, and the number of REs via which the corresponding codeword is transmitted are used to decide the number of encoded symbols for the UCI. Differently from Equation 4, Equation 5 is used to calculate the number of resources where UCI is multiplexed (i.e., the number of encoded symbols), and the number of layers where UCI is multiplexed is multiplied by the calculated number of resources. Therefore, the number of UCI resources in all layers where UCI is multiplexed is given as the same number.

Figure 9:
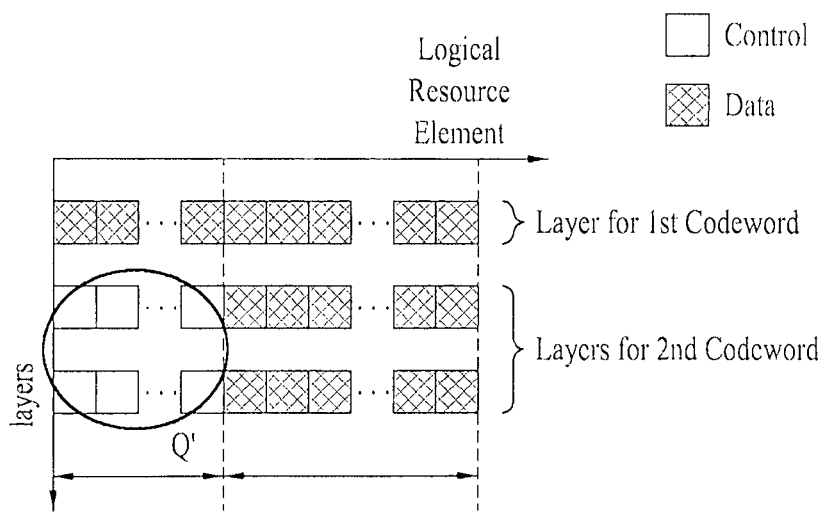

FIG. 9 shows another example in which UCI is multiplexed to one specific codeword using the number of encoded symbols obtained from Equation 5. The method of FIG. 9 can multiplex UCI using the same number of resources within each layer. The above-mentioned example of FIG. 9 may be helpful to a base station (BS) that uses the SIC receiver. In the example of FIG. 9, it is assumed that UCI is multiplexed to a plurality of layers for a second codeword. Referring to FIG. 9, the amounts of UCI resources multiplexed to respective layers are identical to each other.

Embodiment 1C

UCI is Multiplexed to One Codeword Through Codeword Selection

In accordance with the embodiment 1C), if several codewords (e.g., two codewords) (or transport blocks TBs) are transmitted, UCI can be multiplexed to a codeword (or a transport block TB) selected according to the following rules. Preferably, UCI includes channel state information (or channel quality control information). For example, UCI includes CQI and/or CQI/PMI.

Rule 1.1) CQI is multiplexed to a codeword (or a TB) having the highest $I_{MCS}$. Referring to Table 2, the higher the $I_{MCS}$ value, the better the channel state for the corresponding codeword (or TB). Accordingly, CQI is multiplexed to a codeword (or a TB) having the highest $I_{MCS}$ value, such that reliability of transmitting channel state information can be increased.

Rule 1.2) If two codewords (or two TBs) have the same $I_{MCS}$ value, CQI is multiplexed to Codeword 0 (i.e., a first codeword).

FIG. 10 exemplarily shows a DCI structure and a UE analysis according to one embodiment of the present invention. In more detail, FIG. 10 exemplarily shows that DCI carries scheduling information for two transport blocks (TBs).

FIG. 10(*a*) exemplarily shows some parts of a DCI format to be newly added for LTE-A uplink MIMO. Referring to FIG. 10(*a*), a DCI format includes an MCS field and an NDI field for a first transport block (CW0), includes an MCS field and an NDI field for a second transport block (CW0), a PMI/RI field, a resource allocation field (N PRB), and a CQI request field (CQI request).

FIG. 10(*b*) exemplarily shows that two transport blocks (or two codewords) are transmitted and UCI (e.g., channel quality control information) is multiplexed to one (or one codeword) of two transport blocks. Since each of CW0 and CW1 has an MCS of 28 or less and an NDI field is toggled, this means that all of two transport blocks correspond to initial transmission. Since a CQI request field is set to 1 (CQI request=1), aperiodic CQI is multiplexed along with data. Although the CQI request field is set to 0 (CQI request=0), if periodic CQI transmission having PUSCH transmission is planned, the periodic CQI is multiplexed along with data. CQI may include a CQI-only format or a (CQI+PMI) format. In this case, according to the above-mentioned rules, channel state information is multiplexed to a codeword (CW0) (or a transport block) having the highest $I_{MCS}$ value.

FIG. 10(*c*) exemplarily shows that two transport blocks (or two codewords) are transmitted and UCI (e.g., channel quality control information) is multiplexed to one transport block (or one codeword). Since each of CW0 and CW1 has an MCS/RV of 28 or less and an NDI field is toggled, this means that all of two codewords (CW0 and CW1) correspond to initial transmission. Since a CQI request field is set to 1 (CQI request=1), aperiodic CQI is multiplexed along with data. Although the CQI request field is set to 0 (CQI request=0), if periodic CQI transmission having PUSCH transmission is planned, the periodic CQI is multiplexed along with data. CQI may include a CQI-only format or a (CQI+PMI) format. In this case, according to the above-mentioned rules, since two transport blocks have the same $I_{MCS}$ value, channel state information is multiplexed to a codeword CW1 acting as a first transport block.

Equations 6 and 7 exemplarily show methods for calculating the number (Q') of encoded symbols for UCI when UCI is multiplexed to one specific codeword according to the above-mentioned rules. Except for the above-mentioned rules, Equations 6 and 7 are identical to Equations 4 and 5.

[Equation 6]
$$Q' = \left\lceil \frac{Payload_{UCI}}{1} \cdot \frac{1}{SE_{Data(x)}/L_{Data(x)}} \cdot \beta_{offset}^{PUSCH} \right\rceil$$
$$= \left\lceil \frac{Payload_{UCI}}{1} \cdot \frac{1}{Payload_{Data(x)}/L_{Data(x)} \cdot N_{RE\_PUSCH(x)_{initial}}} \cdot \beta_{offset}^{PUSCH} \right\rceil$$
$$= \left\lceil \frac{Payload_{UCI} \cdot L_{Data(x)} \cdot N_{RE\_PUSCH(x)_{initial}} \cdot \beta_{offset}^{PUSCH}}{Payload_{Data(x)}} \right\rceil$$

[Equation 7]
$$Q' = L_{UCI} \cdot \left\lceil \frac{Payload_{UCI}}{1} \cdot \frac{1}{SE_{data(x)}} \cdot \beta_{offset}^{PUSCH} \right\rceil$$
$$= L_{UCI} \cdot \left\lceil \frac{Payload_{UCI}}{1} \cdot \frac{1}{Payload_{Data(x)}/N_{RE\_PUSCH(x)_{initial}}} \cdot \beta_{offset}^{PUSCH} \right\rceil$$
$$= L_{UCI} \cdot \left\lceil \frac{Payload_{UCI}}{Q_m} \cdot \frac{1}{Payload_{Data(x)}/Q_m \cdot N_{RE\_PUSCH(x)_{initial}}} \cdot \beta_{offset}^{PUSCH} \right\rceil$$
$$= L_{UCI} \cdot \left\lceil \frac{Payload_{UCI} \cdot N_{RE\_PUSCH(x)_{initial}} \cdot \beta_{offset}^{PUSCH}}{Payload_{Data(x)}} \right\rceil$$

In Equations 6 and 7, $SE_{Data(x)}$ is a spectral efficiency (SE), and is given as $Payload_{Data(x)}/N_{Re\_PUSCH(x)_{initial}}$. $Q_m$ is a modulation order. Although Equations 6 and 7 show that Q for UCI is identical to $Q_m$ for data, it should be noted that $Q_m$ for UCI and $Q_m$ for data may also be given independent of each other. Except for a subscript or superscript (x), $Payload_{UCI}$, $Payload_{Data(x)}$, $N_{Re\_PUSCH(x)_{initial}}$ ($=m_{SC}^{PUSCH(x)-initial} \cdot N_{symb}^{PUSCH(x)-initial}$), $Q_m$ and $\beta_{offset}^{PUSCH}$ in Equations 6 and 7 are the same as those of Equation 2. The subscript or superscript (x) indicates that the corresponding parameter is used for a transport block x. The transport block x is determined by the above-mentioned rules 1.1) and 1.2). $L_{Data(x)}$ is an integer of 1 or higher, and denotes the number of layers for use in the transport block x. $L_{Data(x)}$ is an integer of 1 or higher, and denotes the number of layers in which UCI is multiplexed. For generalization, each of $L_{UCI}$ and $L_{Data(x)}$ can be replaced with a constant (e.g., α, λ) indicating an integer of 1 or higher. UCI includes CQI/PMI, HARQ ACK/NACK or RI. Preferably, UCI may include CQI/PMI. CQI/PMI may represent a CQI-only format or a (CQI+PMI) format.

If the number of encoded symbols for UCI is the number of encoded symbols for each layer or the rank is set to 1, $L_{UCI}=L_{Data(x)}=1$ is established. Equation 1 of the legacy LTE can be modified into the following Equation 8 according to the above-mentioned rules.

[Equation 8]
$$Q' = \min\left(\left\lceil \frac{(O+L) \cdot M_{sc}^{PUSCH(x)-initial} \cdot N_{symb}^{PUSCH(x)-initial} \cdot \beta_{offset}^{PUSCH}}{\sum_{r=0}^{C^{(x)}-1} K_r^{(x)}} \right\rceil, \right.$$
$$\left. M_{sc}^{PUSCH} \cdot N_{symb}^{PUSCH} - \frac{Q_{RI}}{Q_m} \right)$$

In Equation 8, O is the number of CQI/PMI bits, and L is the number of CRC bits. If O is 11 or less, L is set to 0. If O is 12 or higher, L is set to 8. $Q_{CQI}$ is denoted by $Q_{CQI}=Q_m \cdot Q'$, where $Q_m$ is a modulation order. $Q_{RI}$ is the number of encoded RI bits. If there is no RI transmission, $Q_{RI}$ is set to 0 ($Q_{RI}$=0). $\beta_{offset}^{PUSCH}$ is an offset value, and may be used to adjust the coding rate of CQI/PMI. $\beta_{offset}^{PUSCH}$ is given as $\beta_{offset}^{CQI}$ (i.e., $\beta_{offset}^{PUSCH}=\beta_{offset}^{CQI}$). $M_{sc}^{PUSCH(x)\text{-}initial}$ is a band scheduled for initial PUSCH transmission of the transport block x, and is represented by the number of subcarriers. $N_{symb}^{PUSCH(x)\text{-}initial}$ is the number of SC-FDMA symbols for each subframe for initial PUSCH transmission of the same transport block (i.e., transport block x), and may also be denoted by $N_{symb}^{PUSCH(x)\text{-}initial}=(2 \cdot (N_{symb}^{UL}-1)-N_{SRS})$. $N_{symb}^{UL}$ is the number of SC-FDMA symbols for each slot, and $N_{SRS}$ is 0 or 1. In the case where the UE is configured to transmit PUSCH and SRS in a subframe for initial transmission of the transport block x or in the case where PUSCH resource allocation for initial transmission of the transport block x partially or entirely overlaps with a cell-specific SRS subframe or band, $N_{SRS}$ is set to 1. Otherwise, $N_{SRS}$ is set to 0.

$$\sum_{r=0}^{C^{(x)}-1} K_r^{(x)}$$

is the number of bits of data payload (including CRC) for initial PUSCH transmission of the same transport block (i.e., a transport block x). $C^{(x)}$ is a total number of code blocks for the transport block x, r is a code block number. $K_r$ is the number of bits of the code block (r) for use in the transport block x. $M_{sc}^{PUSCH\text{-}initial}$, C, and $K_r$ are obtained from initial PDCCH for the same transport block (i.e., a transport block x). The transport block x is determined according to the above-mentioned rules 1.1) and 1.2). $\lceil n \rceil$ is a ceiling function, and returns the smallest integer from among at least n values. 'min(a,b)' returns the smallest one of 'a' and 'b'

Embodiment 1D

UCI is Multiplexed to One Codeword Without Codeword Selection

In accordance with the embodiment 1D), UCI can be multiplexed to a predetermined codeword irrespective of new transmission (initial transmission) or retransmission. In this case, parameters used for calculating UCI resources can be partially or entirely updated even in the case of retransmission through a UL grant or the like. In the legacy LTE, when UCI is multiplexed to retransmission PUSCH, the calculation of UCI resources can be performed using information of the initial PUSCH transmission. In contrast, if the UCI is multiplexed to a retransmission PUSCH, UCI resources can be calculated using information of retransmission PUCSH. If parameters used for the UCI resource calculation are changed due to a channel variation or the like during the retransmission, the embodiment 1D) of the present invention includes the context indicating that the changed parameters are partially or entirely updated and used during the UCI resource calculation. In addition, if the number of layers via which the corresponding codeword is transmitted is changed during the retransmission, the embodiment 1D) of the present invention may also reflect the changed result to UCI multiplexing.

In accordance with the embodiment 1D), in Equation 4, $N_{Re\_PUSCH_{initial}}$ may be changed to $N_{Re\_PUSCH_{latest}}$ or $N_{Re\_PUSCH_{recent}}$, etc. $N_{Re\_PUSCH_{latest}}$ or $N_{Re\_PUSCH_{recent}}$ denotes the number of REs of the latest transmission PUSCH. In accordance with the embodiment 1D), since a codeword to which UCI is multiplexed is fixed, the embodiment 1D can be easily and simply implemented without codeword selection or the like. In addition, MCS level variation caused by channel environment variation can be applied to UCI multiplexing, so that it can prevent UCI decoding performance caused by channel variation from being deteriorated.

Embodiment 2A

UCI is Multiplexed to all Codewords

The embodiment 2A provides a method for calculating the amount of UCI resources when UCI is multiplexed to all layers irrespective of the number of codewords. In more detail, the embodiment 2A) provides a method for calculating the spectral efficiency (SE) of each codeword within a subframe via which UCI is transmitted, and calculating the number of encoded symbols for UCI using the sum of calculated SEs (or an inverse number of the sum of calculated SEs). SE of each codeword may be calculated using parameters for initial PUSCH transmission of the same codeword.

Equation 9 exemplarily shows a method for calculating the number (Q') of encoded symbols for UCI when UCI is multiplexed to all layers.

$$Q' = \left\lceil \frac{Payload_{UCI}}{Q_{mUCI}} \cdot \frac{1}{\frac{Payload_{Data(1)}}{L_{Data(1)} \cdot Q_{m(1)} \cdot N_{RE\_PUSCH(1)_{initial}}} + \frac{Payload_{Data(2)}}{L_{Data(2)} \cdot Q_{m(2)} \cdot N_{RE\_PUSCH(2)_{initial}}}} \cdot \beta_{offset}^{PUSCH} \right\rceil \quad \text{[Equation 9]}$$

In Equation 9, $Payload_{UCI}$ and $\beta_{offset}^{PUSCH}$ are identical to those of Equation 2. UCI includes CQI/PMI, ACK/NACK or RI. $Q_{mUCI}$ is a modulation order for the UCI. $Q_{m(1)}$ is a modulation order of the first transport block, and $Q_{m(2)}$ is a modulation order of the second transport block. $Payload_{Data(1)}$ and $Payload_{Data(2)}$ are associated with a first transport block and a second transport block, respectively, and denote the number of bits of data payload (including CRC) for either initial PDCCH transmission for the corresponding transport block or initial PUSCH transmission recognized through a random access response grant for the corresponding transport block. $N_{Re\_PUSCH(1)_{initial}}$ is the number of REs for allocated to PUSCH for initial transmission of the first transport block (corresponding to $n_{sc}^{PUSCH(1)\text{-}initial} \cdot n_{symb}^{PUSCH(1)\text{-}initial}$). $L_{Data(1)}$ or $L_{Data(2)}$ is an integer of 1 or higher. $L_{Data(1)}$ is the number of layers for the first transport block, and $L_{Data(2)}$ is the number of layers for the second transport block.

Although Equation 9 assumes that $Q_{mUCI}$, $Q_{m(1)}$ and $Q_{m(2)}$ are given independently of each other, $Q_{mUCI}=Q_{m(1)}=Q_{m(2)}$ may also be given in the same manner as in LTE. In this case, Equation 9 can be simplified as shown in the following equation 10.

$$Q' = \left\lceil Payload_{UCI} \cdot \frac{1}{\frac{Payload_{Data(1)}}{L_{Data(1)} \cdot N_{RE\_PUSCH(1)_{initial}}} + \frac{Payload_{Data(2)}}{L_{Data(2)} \cdot N_{RE\_PUSCH(2)_{initial}}}} \cdot \beta_{offset}^{PUSCH} \right\rceil$$

$$= \left\lceil \frac{Payload_{UCI}}{1} \cdot \frac{L_{Data(1)} \cdot N_{RE\_PUSCH(1)_{initial}} \cdot L_{Data(2)} \cdot N_{RE\_PUSCH(2)_{initial}}}{Payload_{Data(1)} \cdot L_{Data(2)} \cdot N_{RE\_PUSCH(2)_{initial}} + Payload_{Data(2)} \cdot L_{Data(1)} \cdot N_{RE\_PUSCH(1)_{initial}}} \cdot \beta_{offset}^{PUSCH} \right\rceil$$

[Equation 10]

In addition, if the number (Q') of encoded symbols for UCI may be the number of encoded symbols per layer, or if the rank is 2, $L_{Data1}=L_{Data2}=1$ is given so that Equation 10 can be simplified as shown in the following equation 10.

$$Q' = \left\lceil Payload_{UCI} \cdot \frac{1}{\frac{Payload_{Data(1)}}{N_{RE\_PUSCH(1)_{initial}}} + \frac{Payload_{Data(2)}}{N_{RE\_PUSCH(2)_{initial}}}} \cdot \beta_{offset}^{PUSCH} \right\rceil$$

$$= \left\lceil \frac{Payload_{UCI}}{1} \cdot \frac{N_{RE\_PUSCH(1)_{initial}} \cdot N_{RE\_PUSCH(2)_{initial}}}{Payload_{Data(1)} \cdot N_{RE\_PUSCH(2)_{initial}} + Payload_{Data(2)} \cdot N_{RE\_PUSCH(1)_{initial}}} \cdot \beta_{offset}^{PUSCH} \right\rceil$$

[Equation 11]

Meanwhile, Equation 9 can be generalized as shown in the following equation 12.

In Equations 12 and 13, α or $\lambda_i$ (i=1, ..., N) is an integer of 1 or higher. $\lambda_i$ is a constant, and is given as $1/\lambda_i$. $SE_{Data(i)}$ (where i=1, ..., N) denotes a spectral efficiency (SE) for initial PUSCH transmission of the i-th transport block, and is given as $Payload_{Data(i)}/N_{Re\_PUSCH(i)_{initial}}$.

Figure 11:
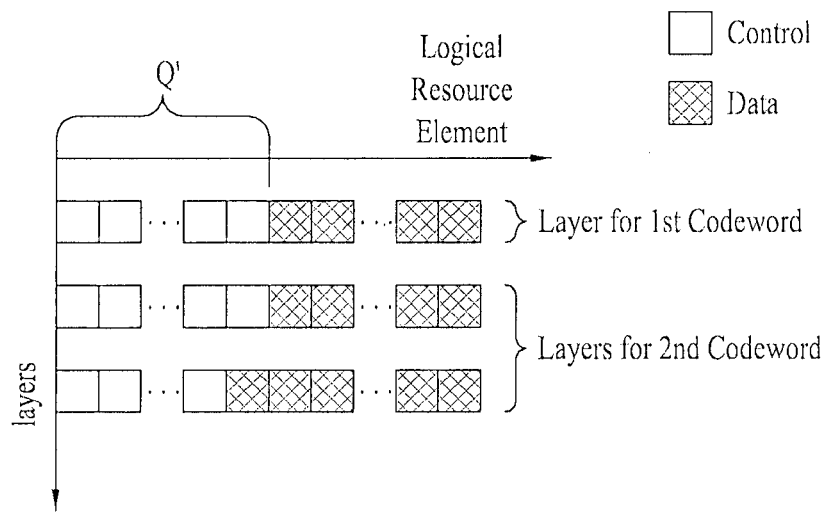
FIGS. 11 to 14 exemplarily show that UCI is multiplexed to a plurality of codewords according to one embodiment of the present invention.

FIG. 11 exemplarily shows that UCI is multiplexed to all codewords using the number of encoded symbols obtained from Equation 9. The method of FIG. 11 can effectively utilize PUSCH resources because only the number of resources actually required for UCI multiplexing is used. As a result, the amounts of UCI resources multiplexed to individual layers are different from each other as shown in FIG. 11. In FIG. 11, in the case where a first codeword is mapped to one layer and a second codeword is mapped to two layers (i.e., rank=3), the number of codewords and the number of layers mapped to each codeword may be determined in various ways.

Equation 14 shows another method for calculating the number (Q') of encoded symbols for UCI when the UCI is multiplexed to all codewords. The method shown in Equation 14 calculates an average amount of multiplexed UCI resources on the basis of a layer, and multiplies the calculated average amount by a total number of layers where UCI is multiplexed. The following Equation 14 can also be modified in the same manner as in Equations 10 to 13.

In Equation 14, $Payload_{UCI}$, $Payload_{Data(1)}$, $Payload_{Data(2)}$, $N_{Re\_PUSCH(1)_{initial}}$, $N_{Re\_PUSCH(2)_{initial}}$, $Q_{mUCI}$, $Q_{m(1)}$, $Q_{m(2)}$, $L_{Data(1)}$, $L_{Data(2)}$, $L_{UCI}$ and $\beta_{offset}^{PUSCH}$ are the same as those of the aforementioned Equations. UCI includes CQI/PMI, ACK/NACK or RI.

Figure 12:
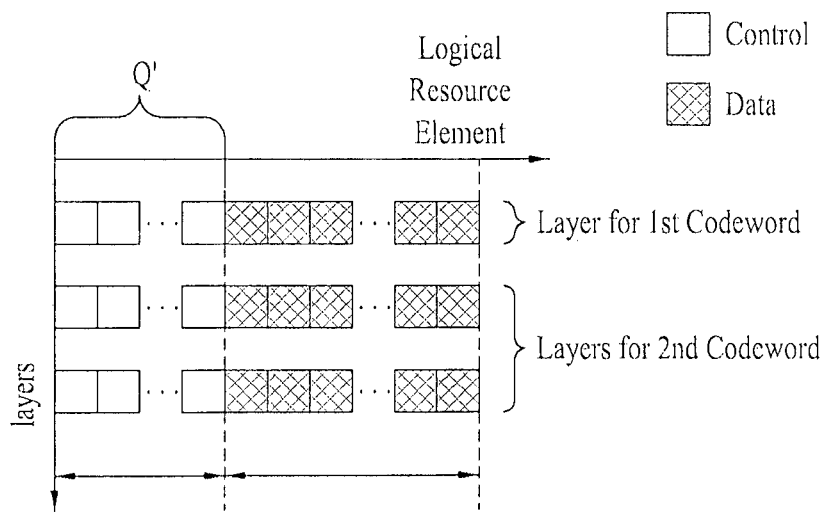

FIG. 12 exemplarily shows that UCI is multiplexed to all codewords using the number of encoded symbols obtained from Equation 14. Referring to FIG. 12, the same amount of UCI resources is multiplexed to individual layers. In other words, the same amount of resources used for UCI multiplexing is assigned to each of all the corresponding layers. The method of FIG. 12 may be helpful to a base station (BS) that uses the SIC receiver. In FIG. 12, although FIG. 12 exemplarily shows that a first codeword is mapped to one layer and a second codeword is mapped to two layers (i.e., Rank=3), it should be noted that the number of codewords and the number of layers mapped to individual codewords may be determined in various ways.

Equations 15 and 16 exemplarily show another method for calculating the number (Q') of encoded symbols for UCI when the UCI is multiplexed to all codewords. The following Equation 14 may also be modified in the same manner as in Equations 10 to 13.

$$Q' = \left\lceil \frac{Payload_{UCI}}{Q_{mUCI}} \cdot \left( \frac{L_{Data(1)} \cdot Q_{m(1)} \cdot N_{RE\_PUSCH(1)_{initial}}}{Payload_{Data(1)}} + \frac{L_{Data(2)} \cdot Q_{m(2)} \cdot N_{RE\_PUSCH(2)_{initial}}}{Payload_{Data(2)}} \right) \cdot \beta_{offset}^{PUSCH} \right\rceil$$

[Equation 15]

[Equation 16]

$$Q' = L_{UCI} \cdot$$

[Equation 14]

$$\left\lceil \frac{Payload_{UCI}}{L_{UCI} \cdot Q_{mUCI}} \cdot \frac{1}{\frac{Payload_{Data(1)}}{L_{Data(1)} \cdot Q_{m(1)} \cdot N_{RE\_PUSCH(1)_{initial}}} + \frac{Payload_{Data(2)}}{L_{Data(2)} \cdot Q_{m(2)} \cdot N_{RE\_PUSCH(2)_{initial}}}} \cdot \beta_{offset}^{PUSCH} \right\rceil$$

-continued $$Q' = L_{UCI} \cdot \left\lceil \frac{Payload_{UCI}}{L_{UCI} \cdot Q_{mUCI}} \cdot \left( \frac{L_{Data(1)} \cdot Q_{m(1)} \cdot N_{RE\_PUSCH(1)_{initial}}}{Payload_{Data(1)}} + \frac{L_{Data(2)} \cdot Q_{m(2)} \cdot N_{RE\_PUSCH(2)_{initial}}}{Payload_{Data(2)}} \right) \cdot \beta_{offset}^{PUSCH} \right\rceil$$

In Equations 15 and 16, $Payload_{UCI}$, $Payload_{Data(1)}$, $Payload_{Data(2)}$, $N_{Re\_PUSCH(1)_{initial}}$, $N_{Re\_PUSCH(2)_{initial}}$, $Q_{mUCI}$, $Q_{m(1)}$, $Q_{m(2)}$, $L_{Data(1)}$, $L_{Data(2)}$, $L_{UCI}$ and $\beta_{offset}^{PUSCH}$ are the same as those of the aforementioned Equations. UCI includes CQI/PMI, ACK/NACK or RI.

Embodiment 2B

UCI is Multiplexed to all Codewords

The embodiment 2B provides another method for calculating the amount of UCI resources when UCI is multiplexed to all layers irrespective of the number of codewords. The embodiment 2B calculates the overall spectral efficiency (SE) of all codewords using parameters of initial transmission of all the codewords in a subframe in which UCI is transmitted, and calculating the number of encoded symbols for UCI using the calculated overall SE.

Equations 17 and 18 illustrate values corresponding to $N_{Re\_PUSCH_{initial}}/Payload_{Data}$ ($=1/SE_{Data}$) shown in Equation 2, and illustrate utilization examples of $$\frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(1)} + Payload_{Data(2)}}.$$

The following Equations 17 and 18 can be modified in the same manner as in Equations 10 to 13.

[Equation 17]

$$Q' = \left\lceil \frac{Payload_{UCI}}{Q_{mUCI}} \cdot \frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(1)} + Payload_{Data(2)}} \cdot \beta_{offset}^{PUSCH} \right\rceil$$

[Equation 18]

$$Q' = L_{UCI} \cdot \left\lceil \frac{Payload_{UCI}}{L_{UCI} \cdot Q_{mUCI}} \cdot \frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(1)} + Payload_{Data(2)}} \cdot \beta_{offset}^{PUSCH} \right\rceil$$

In Equations 16 and 17, $Payload_{UCI}$, $Payload_{Data(1)}$, $Payload_{Data(2)}$, $N_{Re\_PUSCH(1)_{initial}}$, $N_{Re\_PUSCH(2)_{initial}}$, $Q_{mUCI}$, $Q_{m(1)}$, $Q_{m(2)}$, $L_{Data(1)}$, $L_{Data(2)}$, $L_{UCI}$ and $\beta_{offset}^{PUSCH}$ are the same as those of the aforementioned Equations. UCI includes CQI/PMI, ACK/NACK or RI.

Embodiment 2C

UCI is Multiplexed to all Codewords

The embodiment 2C provides another method for calculating the amount of UCI resources when UCI is multiplexed to all layers irrespective of the number of codewords. The embodiment 2C provides a method for calculating the number of encoded symbols for UCI for each transport block. If different codewords have different modulation orders, the embodiment 2C has an advantage in that a modulation order for each codeword can be used as a modulation order of UCI.

Equations 19 and 20 exemplarily illustrate a method (Q') for calculating the number of encoded symbols for UCI. The method shown in Equations 19 and 20 can calculate the number $(Q'_1, Q'_2, \ldots, Q'_N)$ of encoded modulation symbols for UCI for each transport block, as represented by $Q'=Q'_1 + Q'_2 + \ldots + Q'_N$. If modulation orders for use in individual transport blocks are different from one another, UCI uses a modulation order (QPSK, 16QAM, or 64QAM) of the multiplexed transport block. The following Equations 19 and 20 can be modified in the same manner as in Equations 10 to 13.

[Equation 19]

$$Q'_1 = \left\lceil \frac{Payload_{UCI}}{Q_{m(1)}} \cdot \frac{L_{Data(1)} \cdot Q_{m(1)} \cdot N_{RE\_PUSCH(1)_{initial}}}{Payload_{Data(1)}} \cdot \beta_{offset}^{PUSCH} \right\rceil$$

$$Q'_2 = \left\lceil \frac{Payload_{UCI}}{Q_{m(2)}} \cdot \frac{L_{Data(2)} \cdot Q_{m(2)} \cdot N_{RE\_PUSCH(2)_{initial}}}{Payload_{Data(2)}} \cdot \beta_{offset}^{PUSCH} \right\rceil$$

[Equation 20]

$$Q'_1 = L_{Data(1)} \cdot \left\lceil \frac{Payload_{UCI}}{Q_{m(1)}} \cdot \frac{Q_{m(1)} \cdot N_{RE\_PUSCH(1)_{initial}}}{Payload_{Data(1)}} \cdot \beta_{offset}^{PUSCH} \right\rceil$$

$$Q'_2 = L_{Data(2)} \cdot \left\lceil \frac{Payload_{UCI}}{Q_{m(2)}} \cdot \frac{Q_{m(2)} \cdot N_{RE\_PUSCH(2)_{initial}}}{Payload_{Data(2)}} \cdot \beta_{offset}^{PUSCH} \right\rceil$$

In Equations 19 and 20, $Payload_{UCI}$, $Payload_{Data(1)}$, $Payload_{Data(2)}$, $N_{Re\_PUSCH(1)_{initial}}$, $N_{Re\_PUSCH(2)_{initial}}$, $Q_{mUCI}$, $Q_{m(1)}$, $Q_{m(2)}$, $L_{Data(1)}$, $L_{Data(2)}$, $L_{UCI}$ and $\beta_{offset}^{PUSCH}$ are the same as those of the aforementioned Equations. UCI includes CQI/PMI, ACK/NACK or RI.

Equations 21 and 22 exemplarily illustrate a method for calculating the number (Q') of encoded symbols for UCI. The method shown in Equations 21 and 22 can calculate the number $(Q'_1, Q'_2, \ldots, Q'_n)$ of encoded modulation symbols for UCI for each transport block, as represented by $Q'=Q'_1 + Q'_2 + \ldots + Q'_N$. If modulation orders for use in individual transport blocks are different from one another, UCI uses a modulation order (QPSK, 16QAM, or 64QAM) of the multiplexed transport block. The following Equations 21 and 22 can be modified in the same manner as in Equations 10 to 13.

[Equation 21]

$$Q'_1 = \left\lceil \frac{Payload_{UCI}}{L_{UCI(1)} \cdot Q_{m(1)}} \cdot \frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(1)}} \cdot \beta^{PUSCH}_{offset} \right\rceil$$

$$Q'_2 = \left\lceil \frac{Payload_{UCI}}{L_{UCI(2)} \cdot Q_{m(2)}} \cdot \frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(2)}} \cdot \beta^{PUSCH}_{offset} \right\rceil$$

[Equation 22]

$$Q'_1 = L_{Data(1)} \cdot \left\lceil \frac{Payload_{UCI}}{Q_{m(1)}} \cdot \frac{Q_{m(1)} \cdot N_{RE\_PUSCH(1)_{initial}} + Q_{m(2)} \cdot N_{RE\_PUSCH(2)_{initial}}}{Payload_{Data(1)}} \cdot \beta^{PUSCH}_{offset} \right\rceil$$

$$Q'_2 = L_{Data(2)} \cdot \left\lceil \frac{Payload_{UCI}}{Q_{m(2)}} \cdot \frac{Q_{m(1)} \cdot N_{RE\_PUSCH(1)_{initial}} + Q_{m(2)} \cdot N_{RE\_PUSCH(2)_{initial}}}{Payload_{Data(2)}} \cdot \beta^{PUSCH}_{offset} \right\rceil$$

In accordance with the method shown in Equations 21 and 22, $Q'_1$ UCI modulation symbols are multiplexed to a first transport block, and $Q'_2$ UCI modulation symbols are multiplexed to a second transport block. In Equation 21, $Q'_1$ or $Q'_2$ denotes a total number of UCI modulation symbols multiplexed to each codeword, and numbers of UCI modulation symbols multiplexed to individual layers within one codeword may be different from one another. On the other hand, as shown in Equation 22, $Q'_1$ or $Q'_2$ denotes an average number of UCI modulation symbols multiplexed to individual layers, so that the same number of UCI modulation symbols is multiplexed to each layer within one codeword.

Embodiment 2D

UCI are Multiplexed to All Codewords

The embodiment 2D provides a method for calculating the amount of UCI resources when UCI is multiplexed to all layers irrespective of the number of codewords. The embodiment 2D provides a method for calculating the number of encoded symbols for UCI for each transport block. Differently from the embodiment 2C, the embodiment 2D can calculate the ratio of UCI resources multiplexed to each codeword using the number of layers and modulation order of the corresponding codeword in a current transmission subframe. Equations 23 and 24 exemplarily illustrate a method for calculating the number of encoded symbols for UCI according to the embodiment 2D. The embodiment 2D shown in Equations 23 and 24 can calculate the number $(Q'_1, Q'_2, \ldots, Q'_N)$ of encoded modulation symbols for UCI for each transport block, as represented by $Q'=Q'_1+Q'_2+\ldots+Q'_N$. $Q'_1$ or $Q'_2$ UCI modulation symbols are multiplexed to a layer to which the corresponding codeword is transmitted. If individual transport blocks use different modulation orders, UCI may use a modulation order (QPSK, 16QAM, or 64QAM) of the multiplexed transport block. The following equations 23 and 24 can be modified in the same manner as in Equations 10 to 13.

[Equation 23]

$$Q'_1 = \left\lceil \frac{Payload_{UCI}}{Q_{UCI(1)}} \cdot \frac{L_{UCI(1)} \cdot Q_{UCI(1)}}{L_{UCI(1)} \cdot Q_{UCI(1)} + L_{UCI(2)} \cdot Q_{UCI(2)}} \cdot \frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(1)} + Payload_{Data(2)}} \cdot \beta^{PUSCH}_{offset} \right\rceil$$

$$Q'_2 = \left\lceil \frac{Payload_{UCI}}{Q_{UCI(2)}} \cdot \frac{L_{UCI(2)} \cdot Q_{UCI(2)}}{L_{UCI(1)} \cdot Q_{UCI(1)} + L_{UCI(2)} \cdot Q_{UCI(2)}} \cdot \frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(1)} + Payload_{Data(2)}} \cdot \beta^{PUSCH}_{offset} \right\rceil$$

[Equation 24]

$$Q'_1 = L_{UCI(1)} \cdot \left\lceil \frac{Payload_{UCI}}{L_{UCI(1)} \cdot Q_{UCI(1)} + L_{UCI(2)} \cdot Q_{UCI(2)}} \cdot \frac{L_{Data(1)} \cdot Q_{m1} \cdot N_{RE\_PUSCH(1)_{initial}} + L_{Data(2)} \cdot Q_{m(2)} \cdot N_{RE\_PUSCH(2)_{initial}}}{Payload_{Data1} + Payload_{Data(2)}} \cdot \beta^{PUSCH}_{offset} \right\rceil$$

$$Q'_2 = L_{UCI(2)} \cdot \left\lceil \frac{Payload_{UCI}}{L_{UCI(1)} \cdot Q_{UCI(1)} + L_{UCI(2)} \cdot Q_{UCI(2)}} \cdot \frac{L_{Data(1)} \cdot Q_{m(1)} \cdot N_{RE\_PUSCH(1)_{initial}} + L_{Data(2)} \cdot Q_{m(2)} \cdot N_{RE\_PUSCH(2)_{initial}}}{Payload_{Data(1)} + Payload_{Data(2)}} \cdot \beta^{PUSCH}_{offset} \right\rceil$$

In Equations 23 and 24, $Payload_{UCI}$, $Payload_{Data(1)}$, $Payload_{Data(2)}$, $N_{Re\_PUSCH(1)_{initial}}$, $N_{Re\_PUSCH(2)_{initial}}$, $Q_{mUCI}$, $Q_{m(1)}$, $Q_{m(2)}$, $L_{Data(1)}$, $L_{Data(2)}$, $L_{UCI}$ and $\beta^{PUSCH}_{offset}$ are the same as those of the aforementioned Equations 2 and 6. UCI includes CQI/PMI, ACK/NACK or RI. $L_{UCI(1)}$ and $L_{UCI(2)}$ denote the number of layers of a first transport block and the number of layers of a second transport block, respectively. $Q_{UCI(1)}$ and $Q_{UCI(2)}$ denote a modulation order of UCI multiplexed to a first transport block and a modulation order of UCI multiplexed to a second transport block, respectively.

Figure 13:
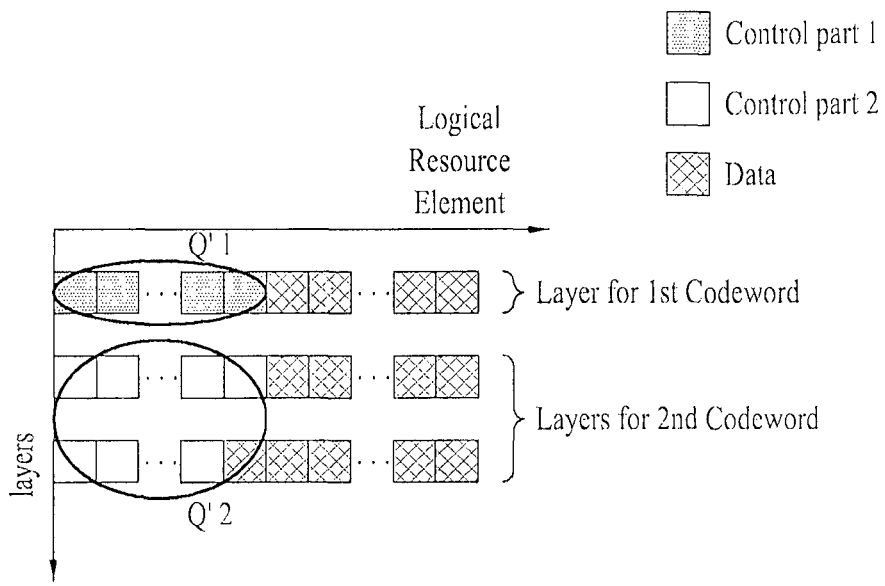
Figure 14:
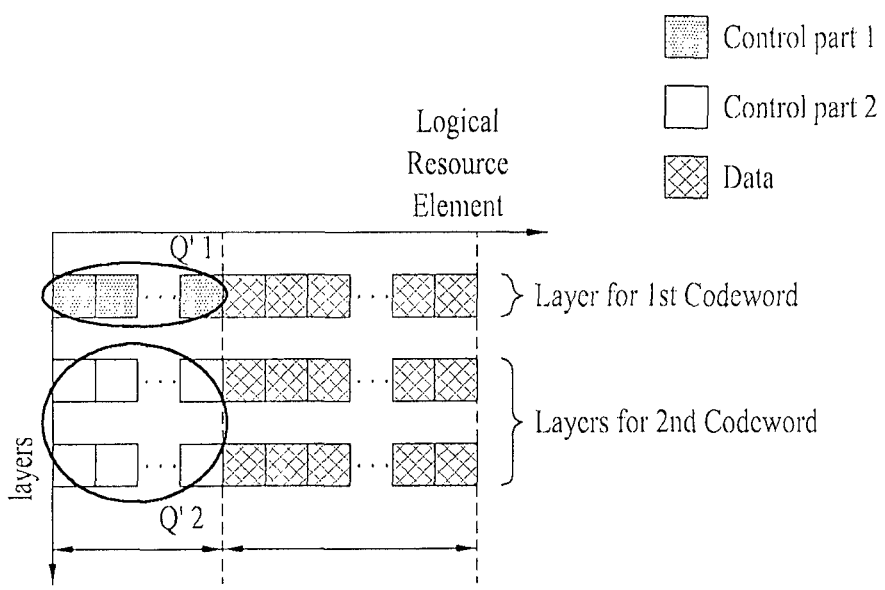

FIGS. 13 to 14 exemplarily show that UCI is multiplexed to all codewords using the number of encoded symbols obtained from Equations 23 and 24. Referring to FIG. 13, $Q'_1$ UCI Part 1 modulation symbols are multiplexed to Codeword 1, and $Q'_2$ UCI Part 2 modulation symbols are multiplexed to Codeword 2. In accordance with Equation 23, $Q'_1$ or $Q'_2$ denotes a total number of UCI modulation symbols multiplexed to each codeword, so that numbers of UCI modulation symbols multiplexed to individual layers within one codeword may be different from each other. On the other hand, as can be seen from Equation 22, $Q'_1$ or $Q'_2$ denotes an average number of UCI modulation symbols multiplexed to individual layers within one codeword, so that the same number of UCI modulation symbols is multiplexed to each layer within one codeword.

In the embodiments 2A to 2D, the scope of a codeword where UCI can be multiplexed is not limited according to UCI types. However, ACK/NACK is multiplexed to all codewords, and CSI information such as CQI/PMI can be multiplexed only to a specific codeword as shown in the embodiments 1A to 1C.

The above-mentioned description does not disclose the upper limit and/or the lower limit used for calculating the number of encoded symbols (See the part (2) of Equation 1), for convenience of description and better understanding of the present invention. For example, after the number of finally determined encoded symbols is calculated through Equations 4 to 24, the upper limit and/or the lower limit can be restricted in the same manner as in Equation 1.

For convenience of description and better understanding of the present invention, the above-mentioned description has disclosed that the number (Q') of encoded symbols for UCI is set to a total number of all symbols. In this case, $Q_{UCI} = Q'_{UCI(total)} \cdot Q_m$ is obtained. $Q_{UCI}$ is a total number of encoded bits for UCI, $Q'_{UCI(total)}$ is a total number of encoded symbols for UCI. $Q_m$ is a modulation order. In this case, the equation for calculating $Q'_{UCI}$ includes parameters related to the number of layers as shown in the above-mentioned equations. On the other hand, according to implementation methods, the number (Q') of encoded symbols for UCI may be determined on the basis of each layer. In this case, $Q_{UCI} = L \cdot Q'_{UCI(layer)} \cdot Q_m$ is obtained. In this case, L is the number of layers where UCI is multiplexed (differently, the number of layers mapped to a UCI-related transport block), $Q'_{UCI(layer)}$ is the number of encoded symbols for UCI for each layer. $Q'_{UCI(layer)}$ is obtained by setting each of all the layer-related parameters shown in the above-mentioned equations to 1.

Figure 15:
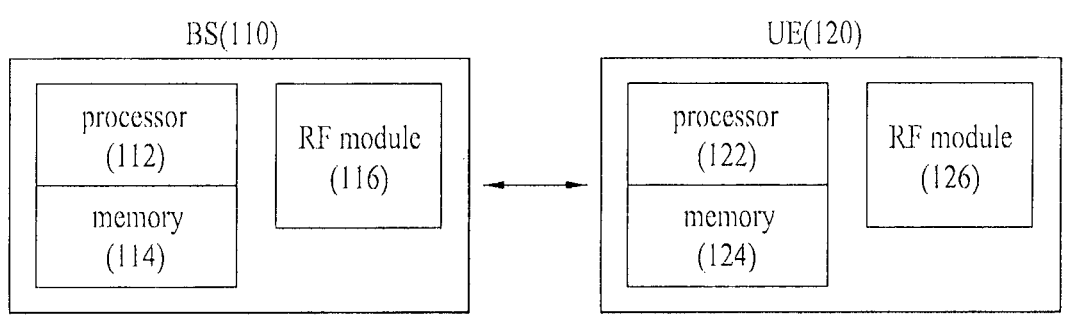
FIG. 15 is a block diagram illustrating a Base Station (BS) and a User Equipment (UE) applicable to embodiments of the present invention.

FIG. 15 is a block diagram illustrating a Base Station (BS) and a User Equipment (UE) applicable to embodiments of the present invention. If a relay is contained in a wireless communication system, a base station (BS) communicates with a relay in a backhaul link, and a relay communicates with a user equipment (UE) in an access link. Therefore, the BS or the UE may be replaced with the relay.

Referring to FIG. 15, a wireless communication system includes a BS 110 and a UE 120. The BS 110 includes a processor 112, a memory 114, and an RF unit 116. The processor 112 may be configured so as to implement the procedures and/or methods of the present invention. The memory 114 is connected to the processor 112 and stores various pieces of information related to operations of the processor 112. The RF unit 116 is connected to the processor 112 and transmits and/or receives RF signals. The UE 120 includes a processor 122, a memory 124, and an RF unit 126. The processor 122 may be configured so as to implement the procedures and/or methods of the present invention. The memory 124 is connected to the processor 122 and stores various pieces of information related to operations of the processor 122. The RF unit 126 is connected to the processor 122 and transmits and/or receives RF signals. The BS 110 and/or the UE 120 may have a single or multiple antennas.

The aforementioned embodiments are achieved by combination of structural elements and features of the present invention in a predetermined type. Each of the structural elements or features should be considered selectively unless specified separately. Each of the structural elements or features may be carried out without being combined with other structural elements or features. Also, some structural elements and/or features may be combined with one another to constitute the embodiments of the present invention. The order of operations described in the embodiments of the present invention may be changed. Some structural elements or features of one embodiment may be included in another embodiment, or may be replaced with corresponding structural elements or features of another embodiment. Moreover, it will be apparent that some claims referring to specific claims may be combined with another claims referring to the other claims other than the specific claims to constitute the embodiment or add new claims by means of amendment after the application is filed.

The embodiments of the present invention have been described based on the data transmission and reception between the base station and the user equipment. A specific operation which has been described as being performed by the base station may be performed by an upper node of the base station as the case may be. In other words, it will be apparent that various operations performed for communication with the user equipment in the network which includes a plurality of network nodes along with the base station can be performed by the base station or network nodes other than the base station. The base station may be replaced with terms such as a fixed station, Node B, eNode B (eNB), and access point. Also, the user equipment may be replaced with terms such as mobile station (MS) and mobile subscriber station (MSS).

The embodiments according to the present invention can be implemented by various means, for example, hardware, firmware, software, or their combination. If the embodiment according to the present invention is implemented by hardware, the embodiment of the present invention can be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

If the embodiment according to the present invention is implemented by firmware or software, the embodiment of the present invention may be implemented by a type of a module, a procedure, or a function, which performs functions or operations described as above. Software code may be stored in a memory unit and then may be driven by a processor. The memory unit may be located inside or outside the processor to transmit and receive data to and from the processor through various means which are well known.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

MODE FOR INVENTION

Various embodiments have been described in the best mode for carrying out the invention.

INDUSTRIAL APPLICABILITY

Exemplary embodiments of the present invention can be applied to a wireless communication system such as a UE, a relay and a BS.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method for transmitting a signal by a user equipment in a wireless communication system, the method comprising:
   channel encoding, by the user equipment, control information;
   generating, by the user equipment, the signal by performing channel interleaving such that the channel encoded control information is multiplexed with a plurality of data blocks; and
   transmitting, by the user equipment, the signal to a base station,
   wherein the number of channel encoded symbols for the control information is determined using the following equation:

$$\left\lceil \frac{Payload_{UCI}}{\alpha} \cdot \frac{\lambda_1 \cdot N_{RE\_PUSCH(1)_{initial}} \cdot \lambda_2 \cdot N_{RE\_PUSCH(2)_{initial}}}{Payload_{Data(1)} \cdot \lambda_2 \cdot N_{RE\_PUSCH(2)_{initial}} + Payload_{Data(2)} \cdot \lambda_1 \cdot N_{RE\_PUSCH(1)_{initial}}} \cdot \beta_{offset}^{PUSCH} \right\rceil$$

where, $Payload_{UCI}$ is a size of the control information, $Payload_{Data(1)}$ is a size of a first data block, $N_{RE\_PUSCH(1)_{initial}}$ is the number of resource elements (REs) for initial PUSCH transmission of the first data block, $Payload_{Data(2)}$ is a size of a second data block, $N_{RE\_PUSCH(2)_{initial}}$ is the number of resource elements (REs) for initial PUSCH transmission of the second data block, $\beta_{offset}^{PUSCH}$ is an offset value, $\alpha$ is an integer of 1 or higher, $\lambda_1$ is an integer of 1 or higher, and $\lambda_2$ is an integer of 1 or higher, and $\lceil \: \rceil$ is a ceiling function.

2. The method according to claim 1, wherein: $N_{RE\_PUSCH(i)initial}$ is denoted by $N_{RE\_PUSCH(i)initial} = M_{sc}^{PUSCH(i)\text{-}initial} \cdot N_{symb}^{PUSCH(i)\text{-}initial}$, and a size of an i-th data block is denoted by $$\sum_{r=0}^{C^i-1} K_r^i,$$

where, $M_{sc}^{PUSCH(i)\text{-}initial}$ is the number of scheduled sub-carriers for initial PUSCH transmission of the i-th data block, $N_{symb}^{PUSCH(i)\text{-}initial}$ is the number of SC-FDMA symbols for initial PUSCH transmission of the i-th data block, $C^{(i)}$ is the number of code blocks of the i-th data block, $K_r^{(i)}$ is a size of r-th code block of the i-th data block, and r is an integer of 0 or higher.

3. The method according to claim 1, wherein $\alpha=1$, $\lambda_1=1$, and $\lambda_2=1$.

4. The method according to claim 1, wherein the control information is acknowledgement/negative acknowledgement (ACK/NACK) or Rank Indicator (RI).

5. A user equipment for transmitting a signal in a wireless communication system, the user equipment comprising:
   a radio frequency (RF) unit; and
   a processor,
   wherein the processor is configured to channel-encode control information, to generate the signal by performing channel interleaving, such that the channel encoded control information is multiplexed with a plurality of data blocks, and to transmit the signal to a base station, and
   wherein the number of channel encoded symbols for the control information is determined using the following equation:

$$\left\lceil \frac{Payload_{UCI}}{\alpha} \cdot \frac{\lambda_1 \cdot N_{RE\_PUSCH(1)_{initial}} \cdot \lambda_2 \cdot N_{RE\_PUSCH(2)_{initial}}}{Payload_{Data(1)} \cdot \lambda_2 \cdot N_{RE\_PUSCH(2)_{initial}} + Payload_{Data(2)} \cdot \lambda_1 \cdot N_{RE\_PUSCH(1)_{initial}}} \cdot \beta_{offset}^{PUSCH} \right\rceil$$

where, $Payload_{UCI}$ is a size of the control information, $Payload_{Data(1)}$ is a size of a first data block, $N_{RE\_PUSCH(1)_{initial}}$ is the number of resource elements (REs) for initial PUSCH transmission of the first data block, $Payload_{Data(2)}$ is a size of a second data block, $N_{RE\_PUSCH(2)_{initial}}$ is the number of resource elements (REs) for initial PUSCH transmission of the second data block, $\beta_{offset}^{PUSCH}$ is an offset value, $\alpha$ is an integer of 1 or higher, $\lambda_1$ is an integer of 1 or higher, and $\lambda_2$ is an integer of 1 or higher, and $\lceil \: \rceil$ is a ceiling function.

6. The user equipment according to claim 5, wherein: $N_{RE\_PUSCH(i)initial}$ is denoted by $N_{RE\_PUSCH(i)initial} = M_{sc}^{PUSCH(i)\text{-}initial} \cdot N_{symb}^{PUSCH(i)\text{-}initial}$, and a size of an i-th data block is denoted by $$\sum_{r=0}^{C^i-1} K_r^i,$$

where, $M_{sc}^{PUSCH(i)\text{-}initial}$ is the number of scheduled sub-carriers for initial PUSCH transmission of the i-th data block, $N_{symb}^{PUSCH(i)\text{-}initial}$ is the number of SC-FDMA symbols for initial PUSCH transmission of the i-th data block, $C^{(i)}$ is the number of code blocks of the i-th data block, $K_r^{(i)}$ is a size of r-th code block of the i-th data block, and r is an integer of 0 or higher.

7. The user equipment according to claim 5, wherein $\alpha=1$, $\lambda_1=1$, and $\lambda_2=1$.

8. The user equipment according to claim 5, wherein the control information is acknowledgement/negative acknowledgement (ACK/NACK) or Rank Indicator (RI).

9. A method for transmitting a signal by a user equipment in a wireless communication system, the method comprising:
   channel encoding, by the user equipment, control information;
   generating, by the user equipment, the signal by performing channel interleaving such that the channel encoded control information is multiplexed with one of a plurality of data blocks; and
   transmitting, by the user equipment, the signal to a base station,
   wherein the number of channel encoded symbols for the control information is determined by the following equation:

$$\alpha \cdot \left\lceil \frac{Payload_{UCI} \cdot N_{RE\_PUSCH(x)_{initial}} \cdot \beta_{offset}^{PUSCH}}{Payload_{Data(x)}} \right\rceil$$

where, α is an integer of 1 or higher, Payload$_{UCI}$ is a size of the control information, Payload$_{Data(x)}$ is a size of a data block x, N$_{RE\_PUSCH(x)_{initial}}$ is the number of resource elements (REs) for initial Physical Uplink Shared Channel (PUSCH) transmission of the data block x, β$_{offset}^{PUSCH}$ is an offset value, and ⌈ ⌉ is a ceiling function, and wherein the data block x denotes a data block having a highest Modulation and Coding Scheme (MCS) index for initial transmission from among the plurality of data blocks, and denotes a 1$^{st}$ data block when the plurality of data blocks have a same MCS index for initial transmission.

10. The method according to claim 9, wherein: N$_{RE\_PUSCH(x)_{initial}}$ is denoted by N$_{RE\_PUSCH(x)_{initial}}$=M$_{sc}^{PUSCH(x)\text{-}initial}$·N$_{symb}^{PUSCH(x)\text{-}initial}$, and a size of the data block x is denoted by $$\sum_{r=0}^{C^{(x)}-1} K_r^{(x)},$$

where, M$_{sc}^{PUSCH(x)\text{-}initial}$ the number of scheduled subcarriers for initial PUSCH transmission of the data block x, N$_{symb}^{PUSCH(x)\text{-}initial}$ is the number of SC-FDMA symbols for initial PUSCH transmission of the data block x, C$^{(x)}$ is the number of code blocks of the data block x, K$_r^{(x)}$ is a size of r-th code block of the data block x, and r is an integer of 0 or higher.

11. The method according to claim 9, wherein α=1.

12. The method according to claim 9, wherein the control information includes information related to channel quality.

13. The method according to claim 9, wherein the control information includes at least one of a Channel Quality Indicator (CQI) and a Precoding Matrix Indicator (PMI).

14. A user equipment for transmitting a signal comprising:
a radio frequency (RF) unit; and
a processor,
wherein the processor is configured to channel-encode control information, to generate the signal by performing channel interleaving, such that the channel encoded control information is multiplexed with a plurality of data blocks, and to transmit the signal to a base station, wherein the number of channel encoded symbols for the control information is determined by the following equation:

$$\alpha \cdot \left\lceil \frac{Payload_{UCI} \cdot N_{RE\_PUSCH(x)_{initial}} \cdot \beta_{offset}^{PUSCH}}{Payload_{Data(x)}} \right\rceil$$

where, α is an integer of 1 or higher, Payload$_{UCI}$ is a size of the control information, Payload$_{Data(x)}$ is a size of a data block x, N$_{RE\_PUSCH(x)_{initial}}$ is the number of resource elements (REs) for initial Physical Uplink Shared Channel (PUSCH) transmission of the data block x, β$_{offset}^{PUSCH}$ is an offset value, and ⌈ ⌉ is a ceiling function, and wherein the data block x denotes a data block having a highest Modulation and Coding Scheme (MCS) index for initial transmission from among the plurality of data blocks, and denotes a 1$^{st}$ data block when the plurality of data blocks have a same MCS index for initial transmission.

15. The user equipment according to claim 14, wherein: N$_{RE\_PUSCH(x)_{initial}}$ is denoted by N$_{RE\_PUSCH(x)_{initial}}$=M$_{sc}^{PUSCH(x)\text{-}initial}$·N$_{symb}^{PUSCH(x)\text{-}initial}$, and a size of the data block x is denoted by $$\sum_{r=0}^{C^{(x)}-1} K_r^{(x)},$$

where, M$_{sc}^{PUSCH(x)\text{-}initial}$ is the number of scheduled subcarriers for initial PUSCH transmission of the data block x, N$_{symb}^{PUSCH(x)\text{-}initial}$ is the number of SC-FDMA symbols for initial PUSCH transmission of the data block x, C$^{(x)}$ is the number of code blocks of the data block x, K$_r^{(x)}$ is a size of r-th code block of the data block x, and r is an integer of 0 or higher.

16. The user equipment according to claim 14, wherein α=1.

17. The user equipment according to claim 14, wherein the control information includes information related to channel quality.

18. The user equipment according to claim 14, wherein the control information includes at least one of a Channel Quality Indicator (CQI) and a Precoding Matrix Indicator (PMI).

* * * * *